US009135165B2

United States Patent
Terada

(10) Patent No.: US 9,135,165 B2
(45) Date of Patent: Sep. 15, 2015

(54) MEMORY CONTROL APPARATUS, MEMORY SYSTEM, INFORMATION PROCESSING SYSTEM, AND MEMORY CONTROL METHOD

(71) Applicant: Sony Corporation, Tokyo (JP)

(72) Inventor: Haruhiko Terada, Tokyo (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 14/039,000

(22) Filed: Sep. 27, 2013

(65) Prior Publication Data
US 2014/0136752 A1 May 15, 2014

(30) Foreign Application Priority Data
Nov. 13, 2012 (JP) ................................. 2012-249435

(51) Int. Cl.
G06F 12/00 (2006.01)
G06F 12/02 (2006.01)
G06F 3/06 (2006.01)
G11C 16/34 (2006.01)
G11C 7/04 (2006.01)

(52) U.S. Cl.
CPC ............ G06F 12/0246 (2013.01); G06F 3/064 (2013.01); G06F 3/0616 (2013.01); G06F 3/0688 (2013.01); G11C 7/04 (2013.01); G11C 16/349 (2013.01); G06F 2212/7206 (2013.01); G06F 2212/7208 (2013.01); G06F 2212/7211 (2013.01)

(58) Field of Classification Search
None
See application file for complete search history.

(56) References Cited

U.S. PATENT DOCUMENTS

| 7,149,644 | B2 * | 12/2006 | Kobayashi et al. | ........... 702/130 |
| 8,051,241 | B2 * | 11/2011 | Feldman et al. | ............. 711/103 |
| 8,189,412 | B2 * | 5/2012 | Mukai et al. | .................. 365/201 |
| 8,213,255 | B2 * | 7/2012 | Hemink et al. | ............... 365/211 |
| 8,612,677 | B1 * | 12/2013 | Motegi | .......................... 711/113 |
| 2009/0204852 | A1 * | 8/2009 | Diggs et al. | ..................... 714/42 |
| 2009/0310408 | A1 * | 12/2009 | Lee et al. | ................. 365/185.03 |
| 2010/0211723 | A1 * | 8/2010 | Mukaida | ....................... 711/103 |
| 2010/0251039 | A1 * | 9/2010 | Hirohata et al. | .............. 714/704 |

(Continued)

FOREIGN PATENT DOCUMENTS

JP 2007-265265 10/2007
KR 2011105095 A * 9/2011

OTHER PUBLICATIONS

'Wear Leveling' article from Wikipedia, archived on Aug. 15, 2012.*

(Continued)

Primary Examiner — Steven Snyder
(74) Attorney, Agent, or Firm — Sony Corporation

(57) ABSTRACT

A memory control apparatus includes a temperature obtaining unit, a priority determination unit, and a write processing unit. The temperature obtaining unit is configured to obtain, in a memory having a plurality of measurement areas each including a plurality of unit areas, temperatures measured in the plurality of measurement areas. The priority determination unit is configured to determine a priority for each unit area in accordance with a degree of consumption and the temperature of the measurement area including the unit areas, the degree of consumption being a degree of consumption of the unit area which is caused by a write process performed. The write processing unit is configured to preferentially perform the write process with respect to the unit area having a higher priority as a data write destination.

17 Claims, 27 Drawing Sheets

(56) References Cited

U.S. PATENT DOCUMENTS

| | | | |
|---|---|---|---|
| 2011/0131367 A1* | 6/2011 | Park et al. | 711/103 |
| 2011/0185224 A1* | 7/2011 | Tsai et al. | 714/6.11 |
| 2011/0213945 A1* | 9/2011 | Post et al. | 711/173 |
| 2011/0320688 A1* | 12/2011 | Lee | 711/103 |
| 2012/0224425 A1* | 9/2012 | Fai et al. | 365/185.09 |
| 2012/0233381 A1* | 9/2012 | Tucek et al. | 711/103 |
| 2013/0073785 A1* | 3/2013 | Emma et al. | 711/103 |
| 2013/0080732 A1* | 3/2013 | Nellans et al. | 711/206 |
| 2013/0148435 A1* | 6/2013 | Matsunaga | 365/185.23 |
| 2013/0282962 A1* | 10/2013 | Rub et al. | 711/103 |
| 2013/0290611 A1* | 10/2013 | Biederman et al. | 711/103 |
| 2014/0050026 A1* | 2/2014 | Li | 365/185.11 |
| 2014/0126292 A1* | 5/2014 | Yang et al. | 365/185.18 |
| 2014/0153315 A1* | 6/2014 | Kwon et al. | 365/148 |
| 2014/0172325 A1* | 6/2014 | Naji | 702/34 |
| 2014/0233132 A1* | 8/2014 | Budiman et al. | 360/69 |

OTHER PUBLICATIONS

'Wear Leveling' application note by Ken Perdue, Spansion Inc., Jun. 15, 2010.*

'Inside Wear Leveling—Increasing flash SSD Reliability' article on StorageSearch, published in Apr. 2005.*

* cited by examiner

314

| | | |
|---|---|---|
| Cell array #1 | Sector #1 | 1050 (Times) |
| | ⋮ | ⋮ |
| | Sector #n | 506 (Times) |
| Cell array #2 | Sector #1 | 552 (Times) |
| | ⋮ | ⋮ |
| | Sector #n | 0 (Times) |
| ⋮ ⋮ | | ⋮ |
| Cell array #m | Sector #1 | 0 (Times) |
| | ⋮ | ⋮ |
| | Sector #n | 0 (Times) |
| | ⋮ | |
| Total write count | | 1510 (Times) |

| Temperature (°C) | Consumption degree per write $\left(\propto \dfrac{1}{\text{Write life}}\right)$ |
|---|---|
| ⋮ | ⋮ |
| 20 | 1.00 |
| ⋮ | ⋮ |
| 30 | 1.25 |
| ⋮ | ⋮ |

| | | |
|---|---|---|
| Cell array #1 | Sector #1 | 10.00 |
| | ⋮ | ⋮ |
| | Sector #n | 20.25 |
| Cell array #2 | Sector #1 | 20.00 |
| | ⋮ | ⋮ |
| | Sector #n | 0 |
| ⋮ | ⋮ | ⋮ |
| Cell array #m | Sector #1 | 0 |
| | ⋮ | ⋮ |
| | Sector #n | 0 |
| | ⋮ | ⋮ |
| Total consumption degree | | 50.00 |

FIG.23

MEMORY CONTROL APPARATUS, MEMORY SYSTEM, INFORMATION PROCESSING SYSTEM, AND MEMORY CONTROL METHOD

CROSS REFERENCE TO RELATED APPLICATIONS

This application claims the benefit of Japanese Priority Patent Application JP 2012-249435 filed Nov. 13, 2012, the entire contents of which are incorporated herein by reference.

BACKGROUND

The present disclosure relates to a memory control apparatus, a memory system, an information processing system, and a memory control method. Specifically, the present disclosure relates to a memory control apparatus, a memory system, an information processing system, and a memory control method for controlling a memory having an upper limit for the number of writes.

In an information processing system in recent years, a non-volatile memory is sometimes used as an auxiliary storage apparatus or a storage. Generally, memory cells that constitute a non-volatile memory deteriorate over time and are worn out due to data writing. When the number of writes reaches a certain count, an error occurrence rate exceeds a tolerance, and the product life of the memory cells is ended.

In a non-volatile memory having a lifetime, when writes are concentrated on a specific address, the memory cell corresponding to the address is consumed, and the life thereof is ended more quickly than others, with the result that the number of memory cells which are incapable of being used may be increased. In view of this, in the non-volatile memory, a leveling process for degrees of consumption of the memory cells is often performed. The process is called as a wear leveling process.

In the wear leveling process, a memory controller has been proposed which records the number of data writes for each address in a flash memory, and an address to which a write is less frequently performed is preferentially set as a write target (see, for example, Japanese Patent No. 4863749). If the degree of consumption of the memory cell caused by one write is assumed to be constant, an address to which the write is less frequently performed has a smaller degree of consumption and thus has a longer remaining life. Therefore, by preferentially writing data to an address to which the write is less frequently performed, the degrees of consumption of the memory cells are leveled.

SUMMARY

However, in related art described above, it may be impossible to level the degrees of consumption of memory cells. In a non-volatile memory, the higher a temperature, the lower a voltage necessary for a write becomes. Further, the higher a temperature, the lower a data retention characteristic (so-called retention) becomes. Therefore, when a write is performed with a constant voltage without considering a temperature, an unnecessary write voltage is applied to a memory cell having a high temperature, with the result that the degree of consumption of the memory cell may be increased (that is, the number of residual writes is decreased).

In the memory controller mentioned above, the wear leveling process is performed with the degrees of consumption due to the write as a constant regardless of the temperature. Thus, when there is a difference in temperature between memory cells, a difference is also caused in the degrees of consumption of the memory cells depending on the temperature difference. As a result, there arises a problem in that the degrees of consumption are not leveled.

In view of the above-mentioned circumstances, it is desirable to appropriately level degrees of consumption in a non-volatile memory.

According to an embodiment of the present disclosure, there are provided a memory control apparatus including a temperature obtaining unit, a priority determination unit, and a write processing unit, and a memory control method. The temperature obtaining unit is configured to obtain, in a memory having a plurality of measurement areas each including a plurality of unit areas, temperatures measured in the plurality of measurement areas. The priority determination unit is configured to determine a priority for each unit area in accordance with a degree of consumption and the temperature of the measurement area including the unit areas, the degree of consumption being a degree of consumption of the unit area which is caused by a write process performed. The write processing unit is configured to preferentially perform the write process with respect to the unit area having a higher priority as a data write destination. As a result, the unit area having a higher priority determined in accordance with the degree of consumption and the temperature is preferentially set as the data write destination.

Further, in the embodiment, the priority determination unit may determine a value of the priority to be lower, as the degree of consumption is increased, and to be lower, as the temperature is increased. As a result, as the degree of consumption is increased, the lower value is determined as the priority. As the temperature is increased, the lower value is determined as the priority.

Further, in the embodiment, the priority determination unit may determine a value of the priority to be lower, as the degree of consumption is increased, and to be higher, as the temperature is increased. As a result, as the degree of consumption is increased, the lower value is determined as the priority. As the temperature is increased, the higher value is determined as the priority.

Further, in the embodiment, the priority determination unit may determine the priority to be a predetermined value in the unit area included in the measurement area, the temperature of which exceeds a predetermined threshold value. As a result, in the unit area included in the measurement area, the temperature of which exceeds the predetermined threshold value, the priority is determined to be the predetermined value.

Further, in the embodiment, the priority determination unit may obtain a characteristic amount on the basis of the temperature of the measurement area and determine the priority when the characteristic amount exceeds a predetermined amount. As a result, in the case where the characteristic amount exceeds the predetermined amount, the priority is determined.

Further, in the embodiment, the priority determination unit may obtain a characteristic amount on the basis of the temperature of the measurement area when a power is turned on, and determine the priority to be a predetermined value when the characteristic amount is equal to or smaller than a predetermined amount. As a result, in the case where the characteristic amount does not exceed the predetermined amount when the power is turned on, the predetermined value is determined as the priority.

Further, in the embodiment, the memory control apparatus may further include a consumption degree supply unit. The consumption degree supply unit is configured to supply, as the degree of consumption, a value obtained in accordance with the temperature of the unit area at a time when the write processing unit performs the write process to the priority determination unit. As a result, the value according to the temperature of the unit area at a time when the write process is performed is supplied to the priority determination unit as the degree of consumption.

Further, in the embodiment, the memory control apparatus may further include a data exchange processing unit. The data exchange processing unit is configured to perform a data exchange process of exchanging data in the unit area, the degree of consumption of which is higher, for data in the unit area, the degree of consumption of which is lower, out of the plurality of unit areas, to level the degrees of consumption in the plurality of unit areas. As a result, by performing the data exchange process, the degrees of consumption in the plurality of unit areas are leveled.

Further, in the embodiment, the data exchange processing unit may determine whether a difference between a maximum value and a minimum value of the degrees of consumption of the plurality of unit areas exceeds a predetermined threshold value or not, each time the degree of consumption is obtained, and perform the data exchange process when the difference exceeds the predetermined threshold value. As a result, in the case where the difference between the maximum value and the minimum value of the degrees of consumption is larger than the threshold value, the data exchange process is performed.

Further, in the embodiment, the data exchange processing unit may perform the data exchange process in the measurement area, the temperature of which is equal to or less than a predetermined temperature. As a result, in the measurement area, the temperature of which does not exceed the predetermined temperature, the data exchange process is performed.

Further, in the embodiment, the priority determination unit may determine the priority, each time a certain time period elapses. As a result, each time the certain time period elapses, the priority is determined.

Further, in the embodiment, the priority determination unit may determine the priority when a total write count exceeds a predetermined count, the total write count being a write count with respect to the memory from when a preceding determination of the priority is performed until when the certain time period elapses. As a result, in the case where the total write count exceeds the predetermined write count, the priority is determined.

Further, in the embodiment, the priority determination unit may determine the priority when a total consumption degree exceeds a predetermined value, the total consumption degree being the degree of consumption of the memory from when a preceding determination of the priority is performed until when the certain time period elapses. As a result, in the case where the total degree of consumption exceeds the predetermined value, the priority is determined.

Further, in the embodiment, the plurality of unit areas each have a physical address allocated thereto, and when writing data to a logical address to which the physical address is unallocated is ordered, the write processing unit may preferentially allocate the physical address of the unit area having a higher priority to the logical address and set the physical address allocated as the data write destination.

According to another embodiment of the present disclosure, there is provided an information processing system including a host computer, a memory, a temperature obtaining unit, a priority determination unit, and a write processing unit. The host computer is configured to order to perform a data write process. The memory has a plurality of measurement areas each including a plurality of unit areas. The temperature obtaining unit is configured to obtain temperatures measured in the plurality of measurement areas. The priority determination unit is configured to determine a priority for each unit area in accordance with a degree of consumption and the temperature of the measurement area including the unit areas, the degree of consumption being a degree of consumption of the unit area which is caused by a write process performed. The write processing unit is configured to preferentially perform the ordered write process with respect to the unit area having a higher priority as a data write destination. As a result, the unit area having the higher priority determined in accordance with the degree of consumption and the temperature is preferentially set as the data write destination.

According to another embodiment of the present disclosure, there is provided a memory system including a memory, a temperature obtaining unit, a priority determination unit, and a write processing unit. The memory has a plurality of measurement areas each including a plurality of unit areas. The temperature obtaining unit is configured to obtain temperatures measured in the plurality of measurement areas. The priority determination unit is configured to determine a priority for each unit area in accordance with a degree of consumption and the temperature of the measurement area including the unit areas, the degree of consumption being a degree of consumption of the unit area which is caused by a write process performed. The write processing unit is configured to preferentially perform the write process with respect to the unit area having a higher priority as a data write destination. As a result, the unit area having a higher priority determined in accordance with the degree of consumption and the temperature is preferentially set as the data write destination.

According to the embodiments of the present disclosure, it is possible to exert such an excellent effect that the degrees of consumption can be appropriately leveled in the non-volatile memory.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 7 is a diagram showing an example of data held in a write count holding unit in the first embodiment;

FIG. 22 is a diagram showing an example of a consumption degree table in the second embodiment;

FIG. 23 is a diagram showing an example of data held in a cumulative consumption degree holding unit in the second embodiment;

DETAILED DESCRIPTION OF EMBODIMENTS

Hereinafter, embodiments of the present disclosure will be described. The description will be given in the following order.

1. First embodiment (example of determining write priority in accordance with number of writes and temperature)
2. Second embodiment (example of determining write priority in accordance with cumulative consumption degree and temperature)

1. First Embodiment

Example of Structure of Information Processing System

Figure 1:
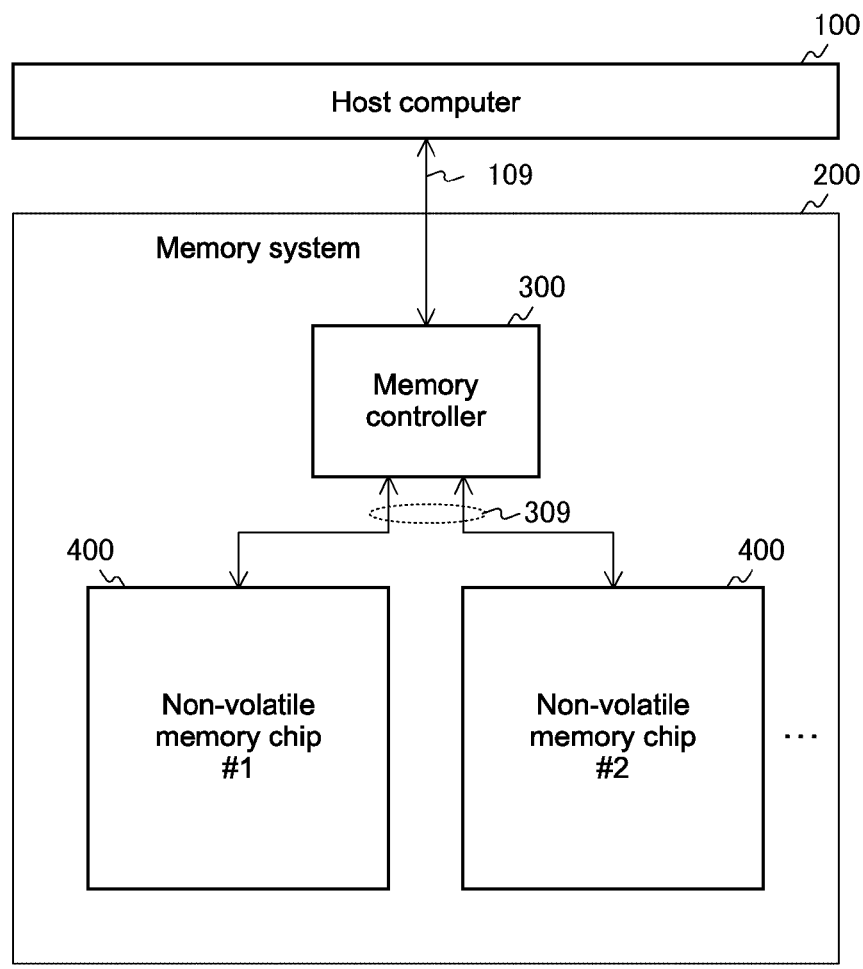
FIG. 1 is a block diagram showing an example of the structure of an information processing system in a first embodiment of the present disclosure.

FIG. 1 is a block diagram showing an example of the structure of an information processing system according to a first embodiment of the present disclosure. The information processing system is provided with a host computer 100 and a memory system 200. The memory system 200 is provided with a memory controller 300 and a plurality of non-volatile memory chips 400.

The host computer 100 controls the memory system 200. Specifically, the host computer 100 issues a command for specifying a logical address of an access destination and supplies the command and data to the memory system 200 via a signal line 109. Further, the host computer 100 receives data read from the memory system 200. Here, the command is used to control the memory system 200 and includes a write command for giving an instruction to perform a data write process and a read command for giving an instruction to perform a data read process. Further, the logical addresses are addresses allocated for each region on an access basis when the host computer 100 accesses the memory system 200 in an address space defined by the host computer 100. The region on the access basis is referred to as a "sector" hereinafter. The size of the sectors is 4 KB (kilobyte), for example.

The memory controller 300 controls the non-volatile memory chips 400. The memory controller 300 receives a write command that specifies the logical address. In addition, the memory controller 300 receives temperature information from each of the non-volatile memory chips 400. The temperature information indicates temperatures measured in the non-volatile memory chips. In response to the write command, the memory controller 300 performs a write process by using the temperature information. The details of method of using the temperature information will be described later. In the write process, the logical address is converted into a physical address, and data is written in the physical address.

Here, the physical addresses are addresses allocated in the non-volatile memory chips 400 on the access basis when the memory controller 300 accesses the non-volatile memory chips 400. The unit of accessing the non-volatile memory chips 400 by the memory controller 300 is the same as the sector. In this case, in the non-volatile memory chips 400, the physical address is allocated for each sector.

For example, in the case where the memory system 200 is provided with four non-volatile memory chips 400, each of which has a capacity of 2 GB (gigabyte), the sum of the capacities is 16 GB, and the number of sectors of the entire memory system 200 is $2^{22}$. In this case, the memory system 200 is managed by the physical address and the logical address of 22 bits.

Further, when receiving the read command that specifies the logical address, the memory controller 300 converts the logical address to the physical address and reads data from the physical address. Then, the memory controller 300 outputs the data read to the host computer 100 as read data.

It should be noted that the size on the access basis by the memory controller 300 is set to be the same as the size on the access basis by the host computer 100 but may be set to be different therefrom.

Example of Structure of Non-Volatile Memory Chip

The non-volatile memory chips 400 each retain data on the basis of the control by the memory controller 300.

Figure 2:
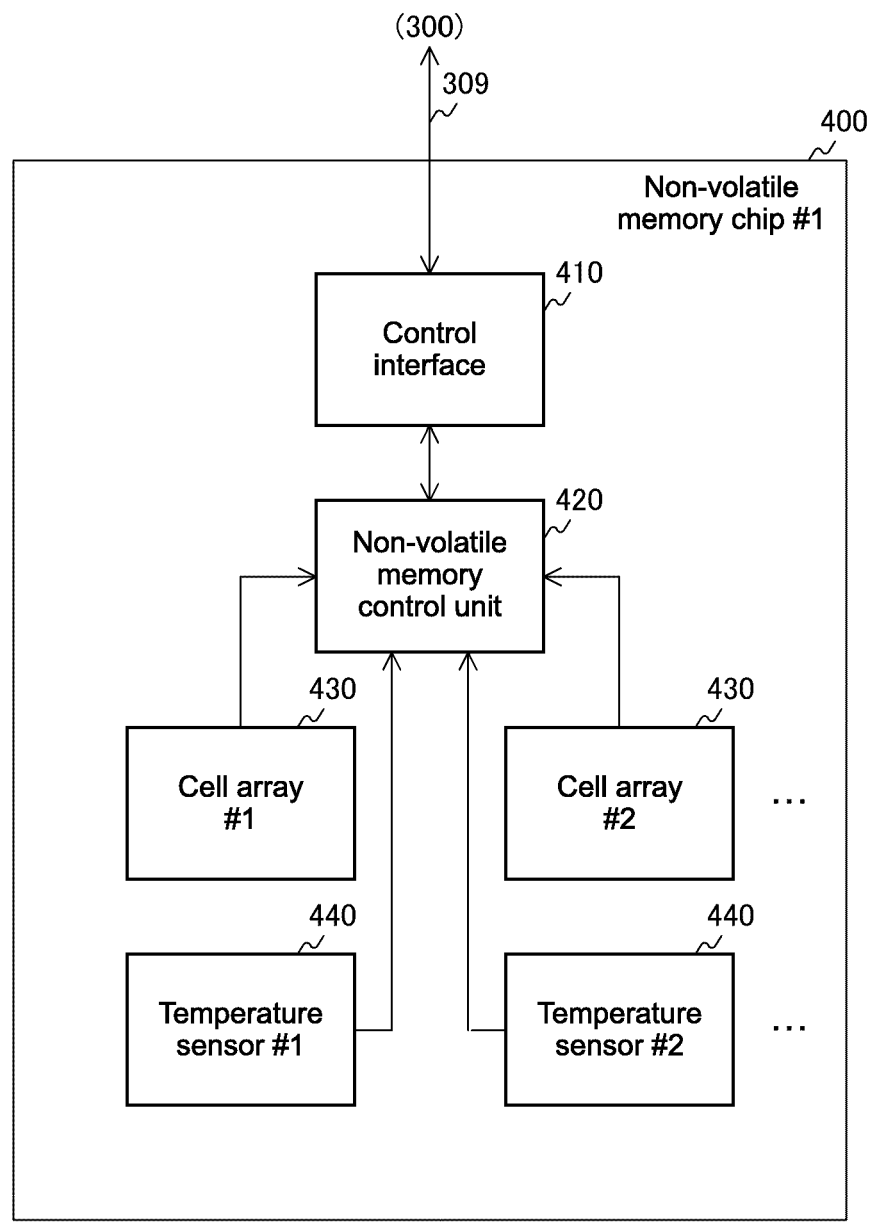
FIG. 2 is a block diagram showing an example of the structure of a non-volatile memory chip in the first embodiment.

FIG. 2 is a block diagram showing an example of the structure of the non-volatile memory chip 400. The non-volatile memory chip 400 is provided with a control interface 410, a non-volatile memory control unit 420, a plurality of cell arrays 430, and a temperature sensor 440 provided to each of the cell arrays 430.

The control interface 410 is an interface for sending and receiving a command, write data, read data, temperature information, and the like to and from the memory controller 300.

The non-volatile memory control unit 420 controls the non-volatile memory chips 400. The non-volatile memory control unit 420 writes data to the cell arrays 430 in response to the write command and read data from the cell arrays 430 in response to the read command. Further, the non-volatile memory control unit 420 obtains a measurement value of each of the temperature sensors 440, generates the temperature information from the measurement values, and outputs the information to the memory controller via the control interface 410.

The cell array 430 includes a plurality of memory cells arranged in an array form. For the memory cells, for example, a ReRAM (resistance RAM) that uses a variable resistive element is used. It should be noted that a memory cell other than the ReRAM may be used as long as a non-volatile storage element is used. For example, a PCRAM (phase-change RAM) or an MRAM (magneto-resistive RAM) may be used.

The temperature sensor 440 is used to measure the temperature of each of the cell arrays 430. The temperature measurement is performed at a certain cycle, for example. The temperature sensors 440 supply measurement values of the temperatures to the non-volatile memory control unit 420.

It should be noted that the temperature sensor 440 is provided for each of the cell arrays 430, but the structure thereof is not limited to this, as long as the entire memory system 200 can measure temperatures of a plurality of measurement areas. For example, one temperature sensor 440 may be provided for the plurality of cell arrays 430, or one cell array 430 is divided into a plurality of measurement areas, and the temperature sensor 440 may be provided for each measurement area. Alternatively, the one temperature sensor 440 may be provided for each of the non-volatile memory chips 400 with the entire non-volatile memory chips 400 as one measurement area.

Example of Structure of Cell Array

Figure 3:
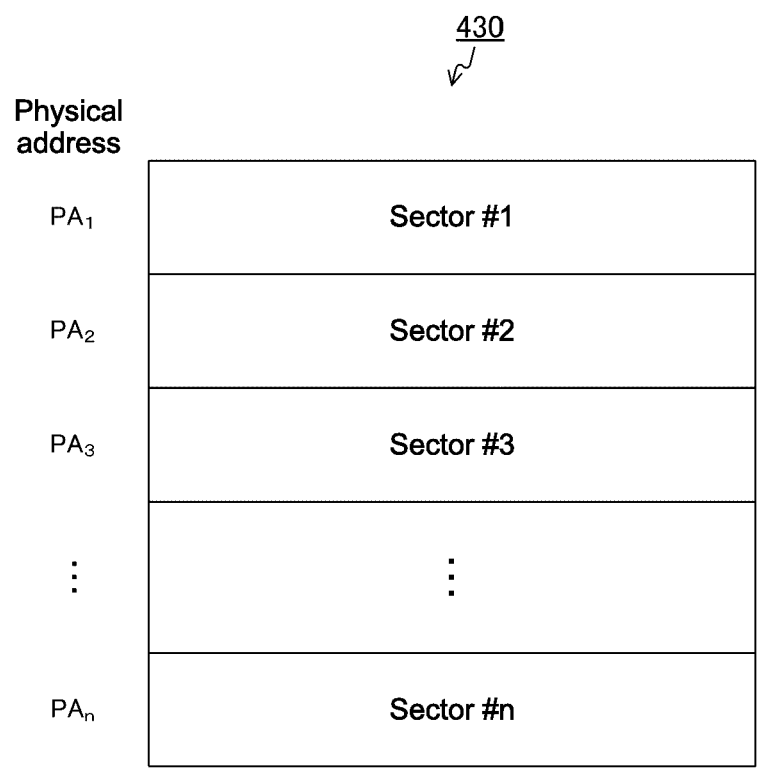
FIG. 3 is a diagram showing an example of the structure of a cell array in the first embodiment.

FIG. 3 is a diagram showing an example of the structure of the cell array 430. The cell array 430 has n sectors (n: integer of 2 or more), and the sectors each have a plurality of memory cells, the number of which is determined in accordance with the size of the sector. The physical address is allocated for each sector.

Example of Structure of Memory Controller

Figure 4:
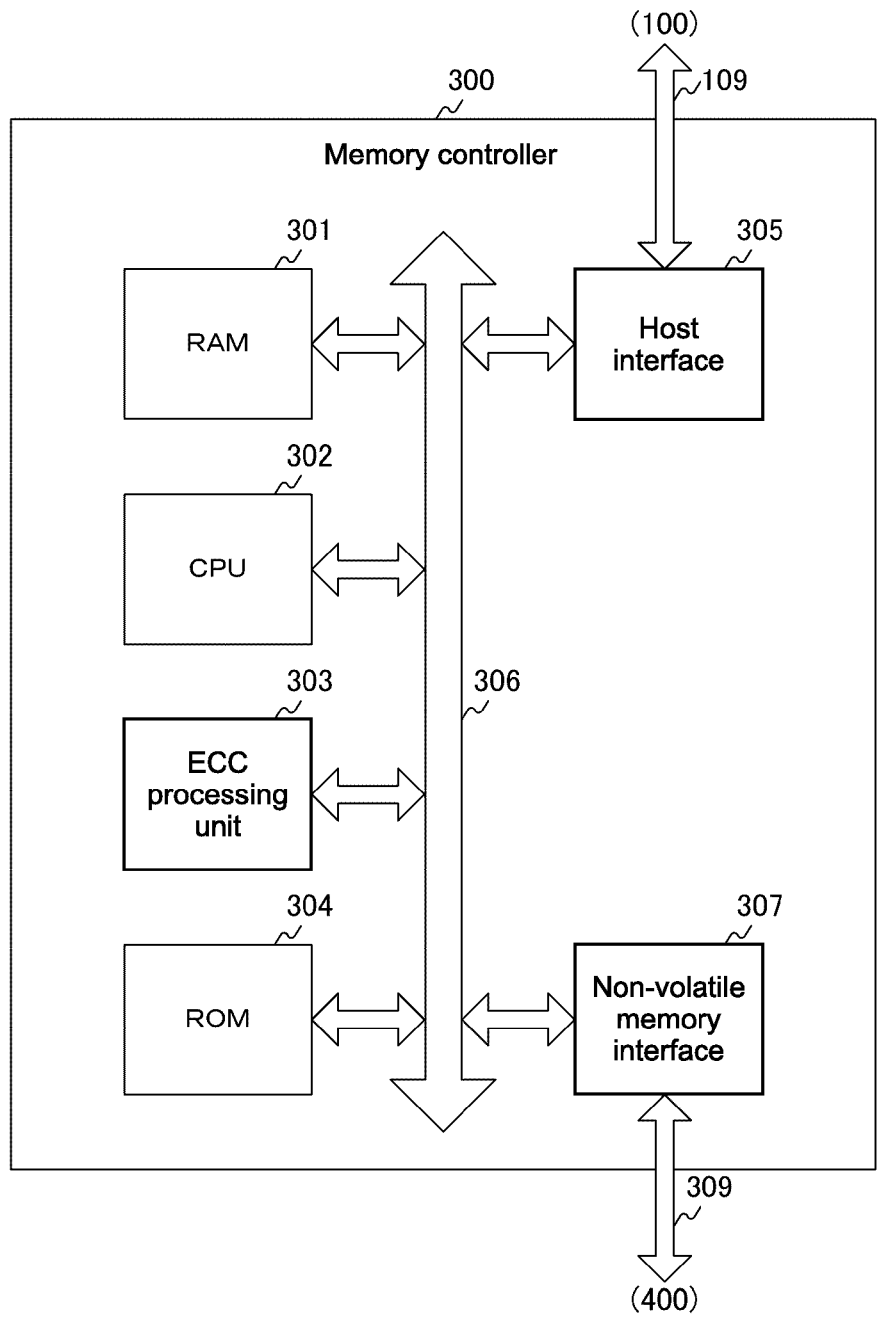
FIG. 4 is a block diagram showing an example of the structure of the memory controller 300 in the first embodiment.

FIG. 4 is a block diagram showing an example of the structure of the memory controller 300 in the first embodiment. The memory controller 300 is provided with a RAM (random access memory) 301, a CPU (central processing unit) 302, an ECC processing unit 303, and a ROM (read only memory) 304. Further, the memory controller 300 is provided with a host interface 305, a bus 306, and a non-volatile memory interface 307.

The RAM 301 temporarily retains data necessary for a process executed by the CPU 302. The CPU 302 performs overall control for the memory controller 300.

The ECC processing unit 303 encodes write data and decodes read data. For example, the ECC processing unit 303 generates redundant data for detecting and correcting an error of the write data and converts (that is, encodes) the write data into a code formed of the redundant data and the write data. In addition, the ECC processing unit 303 uses the redundant data to detect and correct an error in the read data.

The ROM 304 stores a program and the like executed by the CPU 302. The host interface 305 exchanges data or a command with the host computer 100. The bus 306 is a common route for exchanging data for the host interface 305 and the non-volatile memory interface 307. The non-volatile memory interface 307 exchanges the write data, the read data, the command, and the temperature information with the non-volatile memory chips 400.

Figure 5:
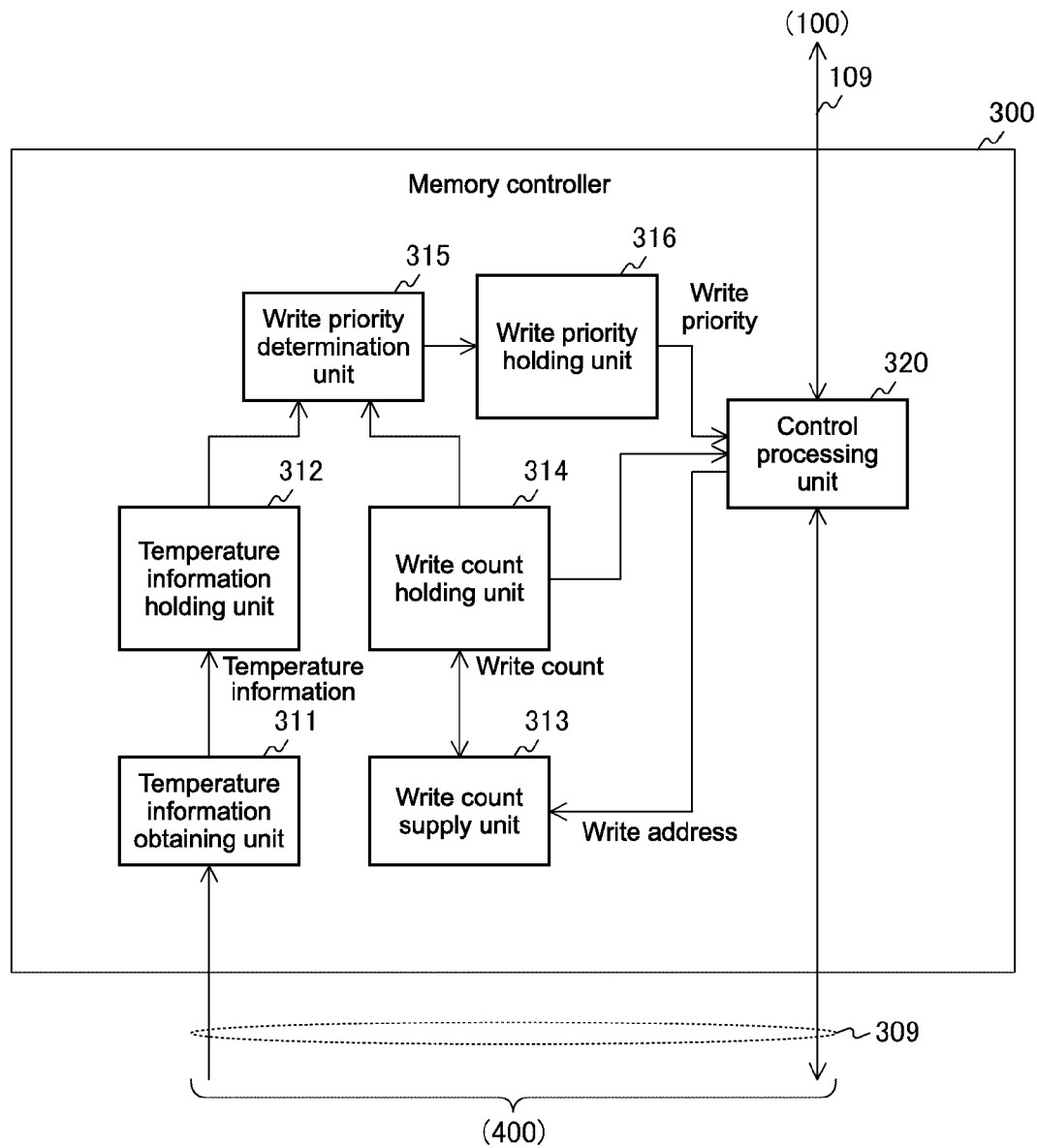
FIG. 5 is a block diagram showing an example of the functional structure of a memory controller according to the first embodiment.

FIG. 5 is a block diagram showing an example of the functional structure of the memory controller 300 according to the first embodiment. The memory controller 300 is provided with a temperature information obtaining unit 311, a temperature information holding unit 312, a write count supply unit 313, a write count holding unit 314, a write priority determination unit 315, a write priority holding unit 316, and a control processing unit 320. The functions shown in FIG. 5 are attained by the units in the structure shown in FIG. 4.

The temperature information obtaining unit 311 obtains the temperature information for each cell array which is generated by the non-volatile memory chips 400. The temperature information obtaining unit 311 causes the temperature information holding unit 312 to hold the temperature information obtained. The temperature information holding unit 312 holds the temperature information for each cell array. It should be noted that the temperature information obtaining unit 311 is an example of a temperature obtaining unit described in the scope of the appended claims.

The write count supply unit 313 supplies the number of writes (write count) for each sector. The write count supply unit 313 counts up the writes to a sector corresponding to a write address each time the write count supply unit 313 receives the write address as an address, to which data is written, from the control processing unit 320. The write count supply unit 313 causes the write count holding unit 314 to hold the count value. Further, each time the write count supply unit 313 receives the write address, the write count supply unit 313 counts up the total writes to the memory system 200 from a time point when the write priority is calculated finally to a current time, and causes the write count holding unit 314 to hold the total write count. The write count holding unit 314 holds the total write count and the write counts of the sectors.

The write priority determination unit 315 determines a write priority for each sector in accordance with the degree of consumption of the sector and the temperature of the sector. The write priority indicates a priority order of the sectors when data is written. For the sector to which a higher write priority is set, the data is more preferentially written thereto.

When the temperature of the memory cells is constant, the degrees of consumption per write process are the same, so the degree of consumption is proportional to the increase in the write count. Therefore, the write count is used as the degree of consumption. The write priority determination unit 315 determines the write priority for each sector in accordance with the write count and the temperature by using the following expression 1.

$$P_1 = 1/T^{\alpha} * N \qquad \text{Expression 1}$$

where $P_1$ represents the write priority of a target sector, the priority of which is to be obtained, a represents a predetermined coefficient determined in accordance with the characteristic of the memory cell. Further, T represents the temperature of the cell array including the target sector, and N represents the write count of the target sector. The unit of T is degree C. (° C.), for example.

From the expression 1, a lower write priority is obtained, as the degree of consumption (for example, write count) is higher, and as the temperature is higher. By writing data preferentially to the memory cell having the higher write priority, the degrees of consumption of the memory cells are appropriately leveled.

It should be noted that the write priority determination unit 315 may obtain the write priority from an expression other than the expression 1, as long as the lower write priority is obtained, as the write count is larger, and the temperature is higher. Further, the write priority determination unit 315 is configured to calculate the write priority by using the expression, but the configuration is not limited to this. For example, the write priority is determined for each combination of the write count and the temperature in advance by using the expression 1 or the like, a table obtained by associating the combinations and the write priorities with each other is held by the write priority determination unit 315, and the write priority may be obtained by referring to the table.

Here, the reason why the appropriate write priority is obtained from the expression 1 or the like will be described. In the non-volatile memory, as the temperature is increased, a write voltage necessary for a data write becomes lower. For example, a necessary write voltage at 150° C. is approximately 0.6 times that at 25° C. Therefore, in the case where the temperature becomes higher (150° C., for example) than expected (25° C., for example), when the data is written in the memory cell with the write voltage at the expected temperature, too much write voltage is applied thereto, so the degree of consumption of the memory cell may be increased. In addition, the higher the temperature, the lower the data retention characteristic becomes. Therefore, as the temperature is increased, it is expected that the degree of consumption of the memory cell becomes higher due to the write process to be executed. Thus, it is desirable that the sectors having higher temperature are set to have lower write priorities.

On the other hand, it is estimated that as the write count is increased, the degree of consumption up to the current time is higher. Therefore, it is desirable that the sector to which the data is written more times is set to have a lower write priority. Thus, by setting the write priority to be lower, as the temperature is higher, and as the write count is larger, the degrees of consumption are leveled appropriately.

For example, under an environment at 25° C., memory cells A and B each having an assured life of 100,000 writes are considered. When 10,000 writes are performed for each of the memory cells A and B, in the case where the same temperature condition is set, both of the memory cells are estimated to have a remaining life of 90,000 writes.

However, in the case where the memory cells A and B are at different temperatures, the degrees of consumption caused by write processes to be performed are not the same, and the remaining lives may be different. For example, the assumption is made that the memory cell A has a higher temperature than the memory cell B. In this state, although the write count for each of the memory cells A and B is 10,000 times, the degree of consumption may be increased, and the remaining life may be shorter than 90,000 times in the memory cell A because the degree of consumption by the write processes tends to be increased as the temperature increases as described above. Therefore, if the write is performed with the same write priority values being set for the memory cells A and B on the basis of only the write counts, the memory cell A may be exhausted more quickly than the memory cell B. In view of this, the memory controller 300 uses the expression 1 or the like to preferentially write data to the memory cell B, the temperature of which is lower, and the consumption of which from that time point is to be reduced, with the result that the degrees of consumption of the memory cells can be appropriately leveled.

The write priority determination unit 315 causes the write priority holding unit 316 to hold the write priorities determined for each sector. Further, when the write priority is calculated, the write priority determination unit 315 updates the total write count in the write count holding unit 314 to an initial value (0, for example). The write priority holding unit 316 holds the write priorities for the respective sectors.

The control processing unit 320 performs the write process with the sector having a higher write priority being preferentially set as a data write destination. Specifically, when the write command is issued, the control processing unit 320 preferentially allocates a physical address of the sector having the higher write priority out of vacant sectors to a logical address specified by the write command. Then, the control processing unit 320 writes data in the physical address allocated and outputs the address to the write count supply unit 313 as the write address.

Here, the sectors in use are not targets to be allocated to the logical address. Therefore, when the write is concentrated on a specific sector of the sectors in use, only the sector is further consumed, and the degrees of concentration of the sectors may not be leveled. In view of this, it is desirable that the control processing unit 320 further performs a data exchange process of exchanging data written in the sectors, the write counts of which are different. Through this process, the data which is more frequently written is moved to the sector, the consumption degree (write count, for example) of which is higher, and the data which is less frequently written is moved to the sector, the consumption degree (write count, for example) of which is lower. After the data is exchanged, the data is frequently written into the sector having a lower degree of consumption, which advances the consumption thereof. The data is less frequently written into the sector having a higher degree of consumption, which does not advance the consumption thereof very much. As a result, the degrees of consumption are leveled.

In the data exchange process, the control processing unit 320 exchanges data between the sector to which the data is written the larger number of times and the sector to which the data is written the smaller number of times. For example, out of the sectors in use, the data is exchanged between the sector to which the data is written the largest number of times and the sector to which the data is written the smallest number of times. The control processing unit 320 outputs the addresses of the sectors between which the data is exchanged to the write count supply unit 313 as the write addresses.

Figure 6:
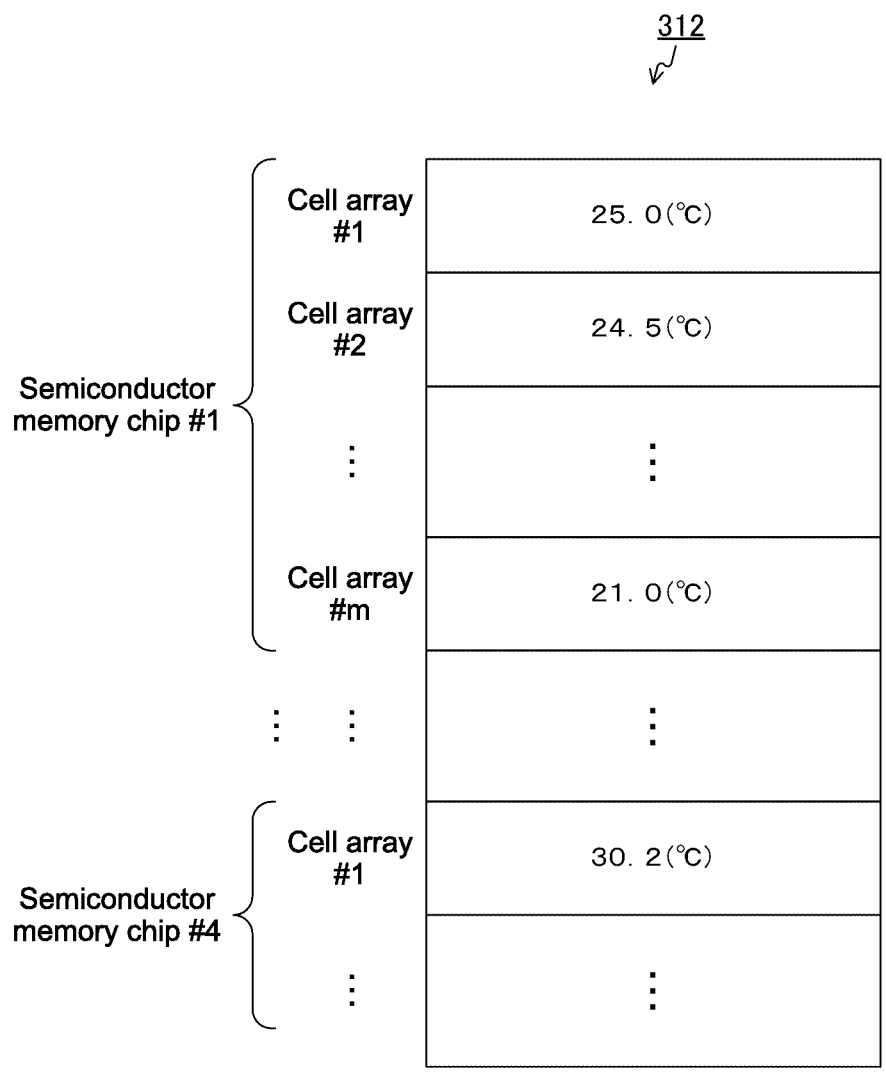
FIG. 6 is a diagram showing an example of data held by a temperature information holding unit in the first embodiment.

FIG. 6 is a diagram showing an example of temperature information held by the temperature information holding unit 312 in the first embodiment. In the temperature information holding unit 312, the temperature information obtained for each array 430 in the non-volatile memory chip 400 is held. For example, in the case where the number of non-volatile memory chips 400 in the memory system 200 is four, and the number of cell arrays 430 in the non-volatile memory chips 400 is m, 4m pieces of temperature information are held in the temperature information holding unit 312.

FIG. 7 is a diagram showing an example of data held in the write count holding unit 314 in the first embodiment. In the write count holding unit 314, the write count is held for each sector in the non-volatile memory chip 400. For example, in the case where the number of cell arrays 430 in the memory system 200 is 4m, and the number of sectors for each cell array 430 is n, the number of sectors is 4m*n, and 4m*n write counts are held. Further, in the write count holding unit 314, the total write count is held.

Figure 8:
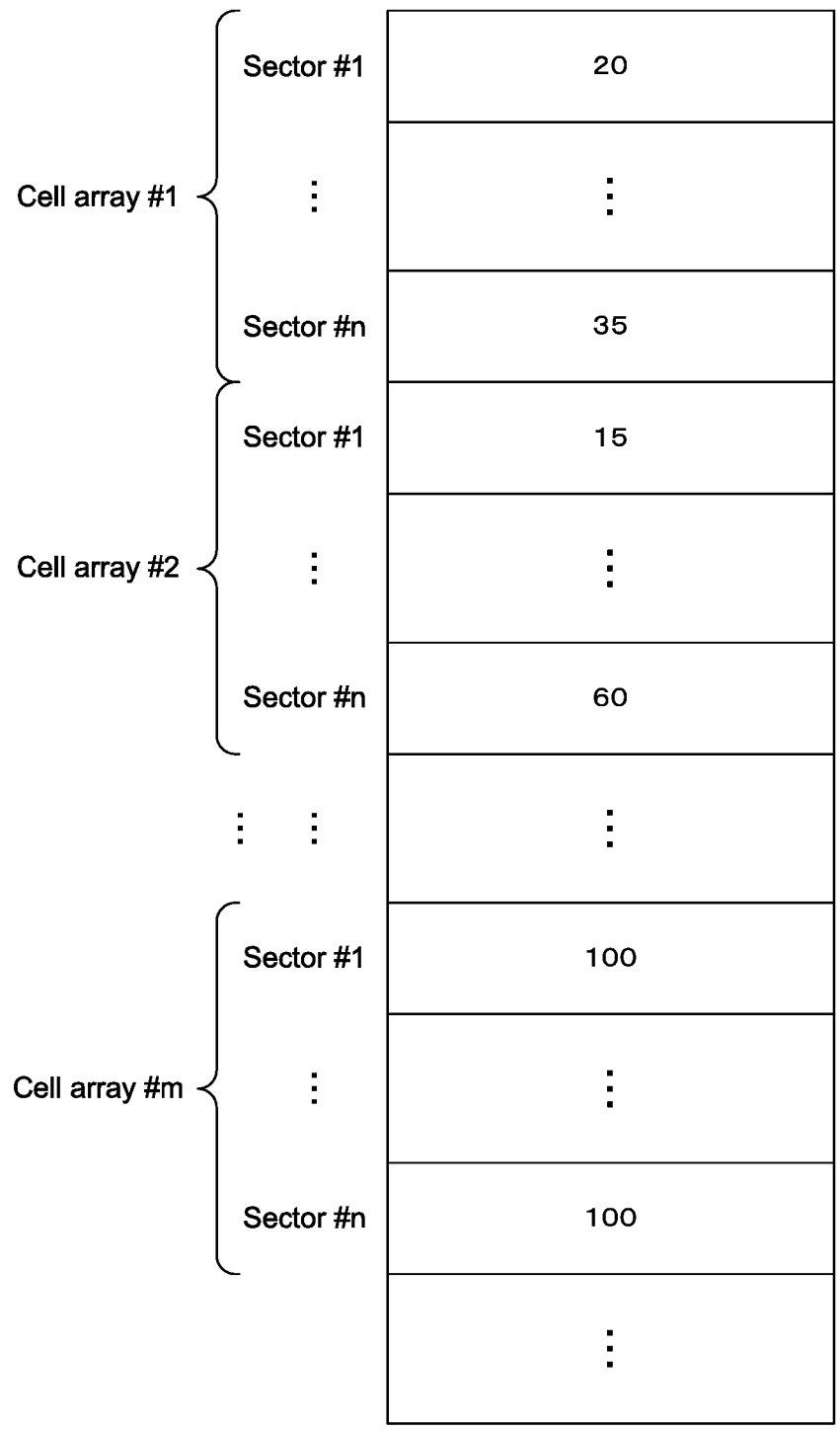
FIG. 8 is a diagram showing an example of data held by a write priority holding unit in the first embodiment.

FIG. 8 is a diagram showing an example of data held by the write priority holding unit 316 in the first embodiment. The write priority holding unit 316 holds the write count for each sector in the non-volatile memory chip 400. For example, in the case where the number of sectors in the memory system 200 is 4m*n, 4m*n write priorities are held.

Example of Structure of Control Processing Unit

Figure 9:
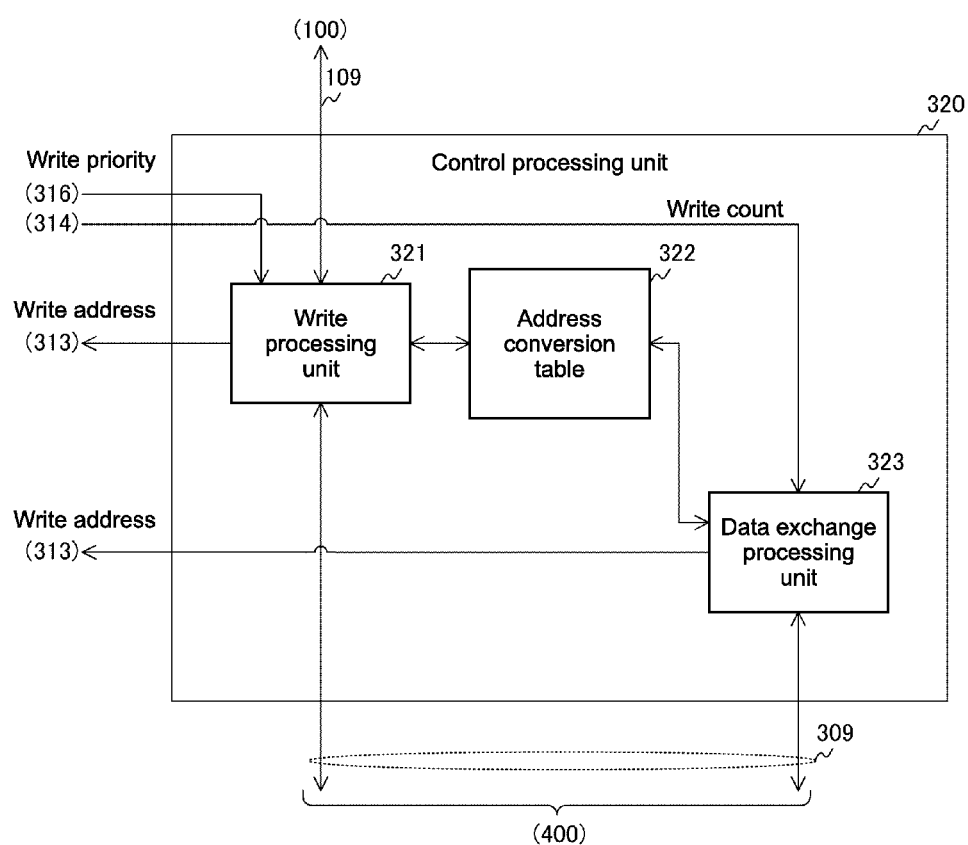
FIG. 9 is a block diagram showing an example of the structure of a control processing unit in the first embodiment.

FIG. 9 is a block diagram showing an example of the structure of the control processing unit 320 in the first embodiment. The control processing unit 320 is provided with a write processing unit 321, an address conversion table 322, and a data exchange processing unit 323.

The write processing unit 321 performs a write process with the sector having a higher write priority as a write destination. Upon reception of a write command from the host computer 100, the write processing unit 321 refers to the address conversion table 322 to determine whether the physical address is allocated to the logical address specified by the write command or not. When the physical address is allocated, the write processing unit 321 writes write data in the corresponding physical address. On the other hand, when the physical address is not allocated, out of vacant physical addresses, the write processing unit 321 preferentially allocates the sector having the higher write priority to the logical address and writes the write data to the physical address. In addition, on the basis of the allocation of the physical addresses, the write processing unit 321 updates the address conversion table 322. The address conversion table 322 holds the logical address and the physical address with the addresses associated with each other.

The data exchange processing unit 323 performs a data exchange process. The data exchange processing unit 323 determines whether the data exchange process is performed each time the data is written. For example, the data exchange processing unit 323 calculates a difference between a maximum value and a minimum value of the write counts of the sectors and determines whether the data exchange process is to be executed or not on the basis of whether the difference calculated exceeds a predetermined threshold value W1.

In the case where the data exchange process is performed, the data exchange processing unit 323 exchanges the data between the sector to which the write is performed the largest number of times and the sector to which the write is performed the smallest number of times. Specifically, the data exchange processing unit 323 reads the data from a physical address $PA_{max}$ of the sector to which the write is performed the largest number of times and a physical address $PA_{min}$ of the sector to which the write is performed the smallest number of times and holds the data. Then, the data exchange processing unit 323 writes the data read from the physical address $PA_{max}$ to the physical address $PA_{min}$, and the data read from the physical address $PA_{min}$ to the physical address $PA_{max}$. In addition, the data exchange processing unit 323 allocates the physical address $PA_{min}$ to the logical address corresponding to the physical address $PA_{max}$ before the exchange and allocates the physical address $PA_{max}$ to the logical address corresponding to the physical address $PA_{min}$ before the exchange.

It should be noted that the data exchange process is not limited to the process of exchanging the data between the sector to which the write is performed the largest number of times and the sector to which the write is performed the smallest number of times, as long as the data is exchanged between the plurality of sectors having different degrees of consumption (write counts, for example) in the process. The data exchange processing unit 323 obtains an average value of the write counts, for example, and may exchange the data between the sector having the write count equal to or larger than a value M (M: real number of more than 1) times the average value and the sector having the write count equal to or smaller than a value N (N: real number of less than 1) times the average value.

Example of Structure of Address Exchange Table

Figure 10:
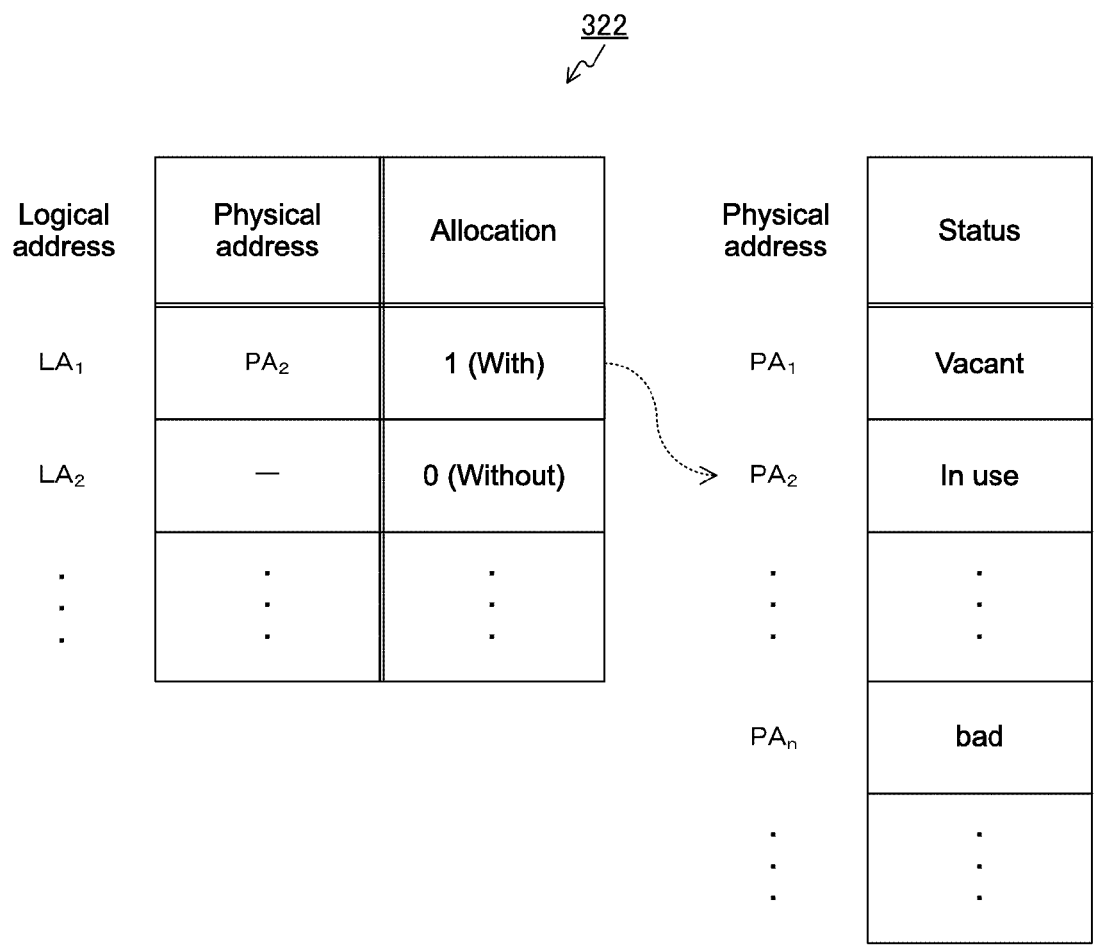
FIG. 10 is a diagram showing an example of an address exchange table in the first embodiment.

FIG. 10 is a diagram showing an example of the address exchange table 322 in the first embodiment. In the address conversion table 322, for example, information indicating the physical addresses and whether there is an allocation or not for each logical address. Whether there is the allocation or not indicates whether the physical address is allocated to the logical address. In an initial state, the physical address is not allocated. In the case where the physical address is not allocated to the logical address when the data is written, the physical address is allocated to the logical address.

Further, in the address conversion table 322, information indicating a status of the physical address for each physical address is held. The status indicates a usage condition or the like of the physical address, and one of "in use", "vacant", and "bad" is indicated. The "in use" means that the logical address is allocated to the physical address in the status, and the data is written. The "vacant" means that the data is not written in the physical address in the status. The "bad" means that the sector corresponding to the physical address in the status is a bad sector, the life of which ends.

The write processing unit 321 determines whether the physical address is allocated or not to the logical address specified by the write command. When there is no allocation, the write processing unit 321 allocates the physical address having the highest write priority out of the physical addresses in the vacant status and associates the physical address and the logical address with each other to be held.

For example, the case is considered in which the physical address is not allocated to a logical address $LA_2$, the plurality of physical addresses including a physical address $PA_1$ are in the vacant status, and the physical address $PA_1$ has the highest write priority. When a write command to specify the logical address $LA_2$ is issued, the memory controller 300 allocates, out of the vacant physical addresses, the physical address $PA_1$ having the highest write priority to the logical address $LA_2$. The address conversion table 322 holds information indicating the physical address $PA_1$ and indicating that there is the allocation with the address associated with the logical address $LA_2$. Further, the status of the physical address $PA_1$ is updated to "in use".

Example of Operation of Memory Controller

Figure 11:
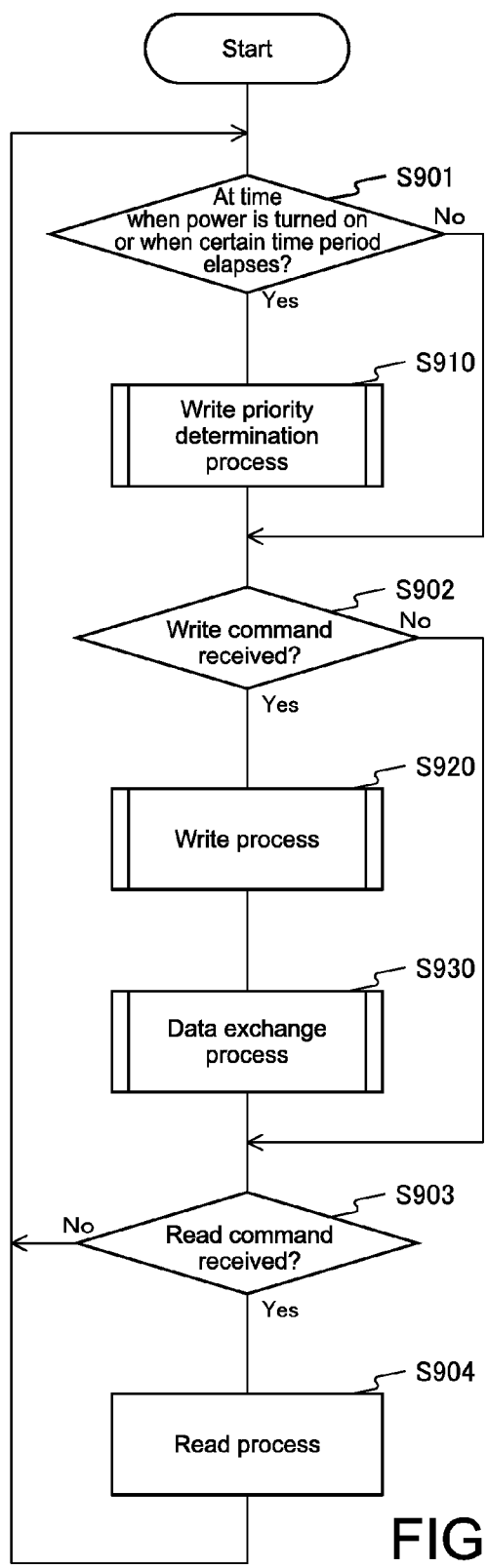
FIG. 11 is a flowchart showing an example of the operation of the memory controller in the first embodiment.

FIG. 11 is a flowchart showing an example of the operation of the memory controller 300 in the first embodiment. The operation is started when the memory controller 300 is turned on. The memory controller 300 determines whether one of the case where the power is turned on and the case where a certain time period elapses from when the write priority determination process is executed is caused or not (Step S901).

Generally, a write command and a read command are demanded to be responsive to a command from the host. Therefore, in the flowchart shown in FIG. 11, a response time demanded for the write command and the read command is a time period in the unit of nanosecond or microsecond. On the other hand, for the write priority, the expression 1 is defined so that the write priority is remarkably changed only in the unit of at least millisecond, thereby sufficiently leveling the degrees of consumption. Therefore, it is appropriate that the update of the write priorities is performed every certain time period as in Step S901.

When the case where the power is turned on or the case where the certain time period elapses is caused (Yes in Step S901), the memory controller 300 performs the write priority determination process for determining the write priority for each sector (Step S910).

When neither the case where the power is turned on nor the case where the certain time period elapses is caused (No, in Step S901), or after Step S910, the memory controller 300 determines whether the write command is received or not from the host computer 100 (Step S902).

When the write command is received (Yes in Step S902), the memory controller 300 performs the write process of writing the data to the non-volatile memory chip 400 (Step S920). Then, the memory controller 300 executes the data exchange process for exchanging the data written in the physical addresses having different write priorities (Step S930).

When the write command is not received (No in Step S902), or after Step S930, the memory controller 300 determines whether the read command is received from the host computer 100 or not (Step S903). When the read command is received (Yes in Step S903), the memory controller 300 performs the read process for reading the data from the physical address corresponding to the logical address specified in the read command. The memory controller 300 outputs the data read to the host computer 100 as the read data (Step S904).

When the read command is not received (No in Step S903), or after Step S904, the memory controller 300 returns to Step S901.

Figure 12:
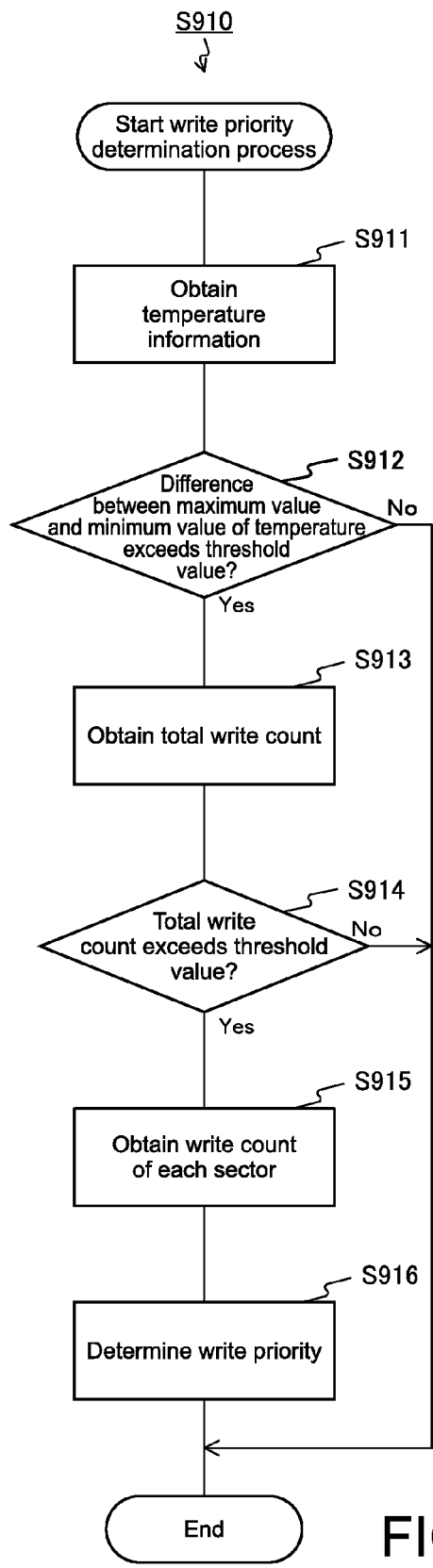
FIG. 12 is a flowchart showing a write priority determination process in the first embodiment.

FIG. 12 is a flowchart showing an example of the write priority determination process in the first embodiment. The write priority determination unit 315 in the memory controller 300 reads the temperature information of the sectors from the temperature information holding unit 312 to obtain the information (Step S911). Then, the write priority determination unit 315 obtains a difference between a maximum value and a minimum value of the temperatures of the cell array and determines whether the difference exceeds a threshold value T1 or not (Step S912). When the difference exceeds the threshold value T1 (Yes in Step S912), the write priority determination unit 315 reads and obtains a total write count with respect to the memory system 200 from a time point when the write priority is finally calculated up to a current time point from the write count holding unit 314 (Step S913). Then, the write priority determination unit 315 determines whether the total write count exceeds a threshold value W1' or not (Step S914). When the total write count exceeds the threshold value W1' (Yes in Step S914), the write priority determination unit 315 reads and obtains the write counts of the sectors from the write count holding unit 314 (Step S915). By using the expression 1 or the like, the write priority determination unit 315 determines the write priority for each sector in accordance with the temperatures and the write counts and causes the write priority holding unit 316 to hold the write priorities determined. In addition, the write priority determination unit 315 sets the total write count to an initial value (for example, 0) (Step S916). By executing the processes of Step S912 and S914, it is possible to reduce the frequency of calculating the write priorities. In the case where the difference is less than the threshold value T1 (No in Step S912), or after Step S915, the write priority determination unit 315 terminates the write priority determination process.

It should be noted that, in Step S912, whether the difference between the maximum value and the minimum value of the temperature is larger than the threshold value T1 or not is determined, but whether a characteristic amount other than the difference exceeds the threshold value T1 or not may be determined, as long as the characteristic amount is calculated from a temperature distribution. As the characteristic amount, in addition to the difference between the maximum value and the minimum value, the maximum value or the minimum value of the temperatures is used. Further, the write priority determination unit 315 calculates the write priority in the case where the characteristic amount (difference, for example) exceeds the threshold value T1, and the total write count exceeds the threshold value W1'. However, the write priority determination unit 315 may calculate the write priority in the case where the characteristic amount exceeds the threshold value T1, or the total write count exceeds the threshold value W1'. Further, the write priority determination unit 315 may not necessarily perform the processes of Steps S912 and S914. Only one of the processes of Steps S912 and S914 may be performed, or neither Step S912 nor Step S914 may be performed. Here, in the case where Step S914 for comparing the total write count with the threshold value is not performed, Step S913 for obtaining the total write count also has not to be performed.

Figure 13:
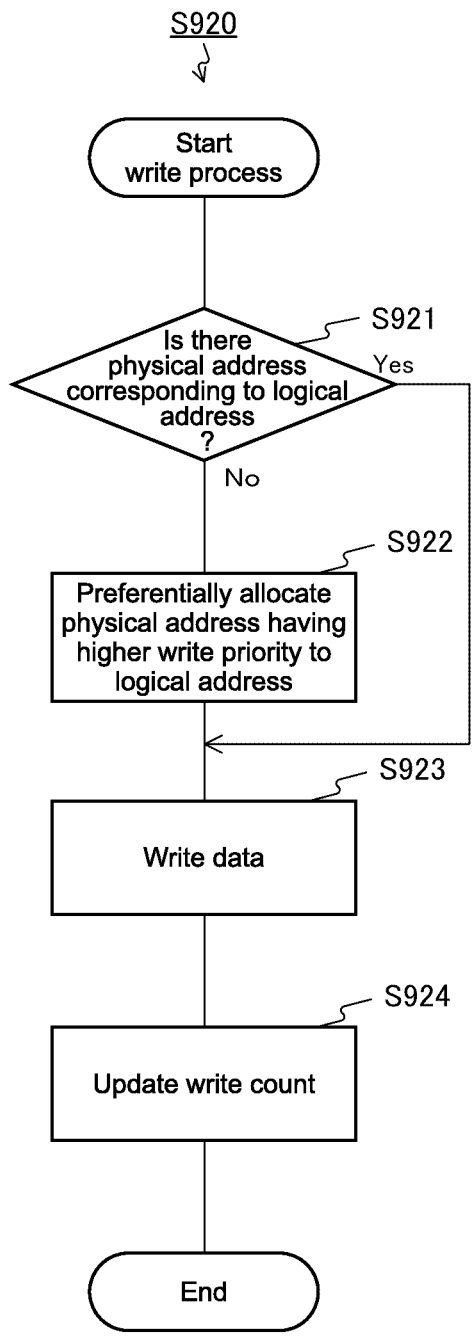
FIG. 13 is a flowchart showing an example of a write process in the first embodiment.

FIG. 13 is a flowchart showing an example of the write process in the first embodiment. The control processing unit 320 in the memory controller 300 refers to the address conversion table 322 to determine whether the physical address corresponding to the logical address specified by the write command is included or not (Step S921).

When the corresponding physical address is not included (No in Step S921), the control processing unit 320 preferentially allocates the physical address of the vacant sector having the higher write priority to the logical address specified (Step S922).

When the corresponding physical address is included (Yes in Step S921), or after Step S922, the control processing unit 320 writes the data to the physical address corresponding to the logical address specified (Step S923). Then, the control processing unit 320 informs the write count supply unit 313 of the physical address to which the data is written. The write count supply unit 313 updates the write count of the physical address which is held in the write count holding unit 314. In addition, the write count supply unit 313 updates the total write count held in the write count holding unit 314 (Step S924). After Step S924, the control processing unit 320 terminates the write process.

Figure 14:
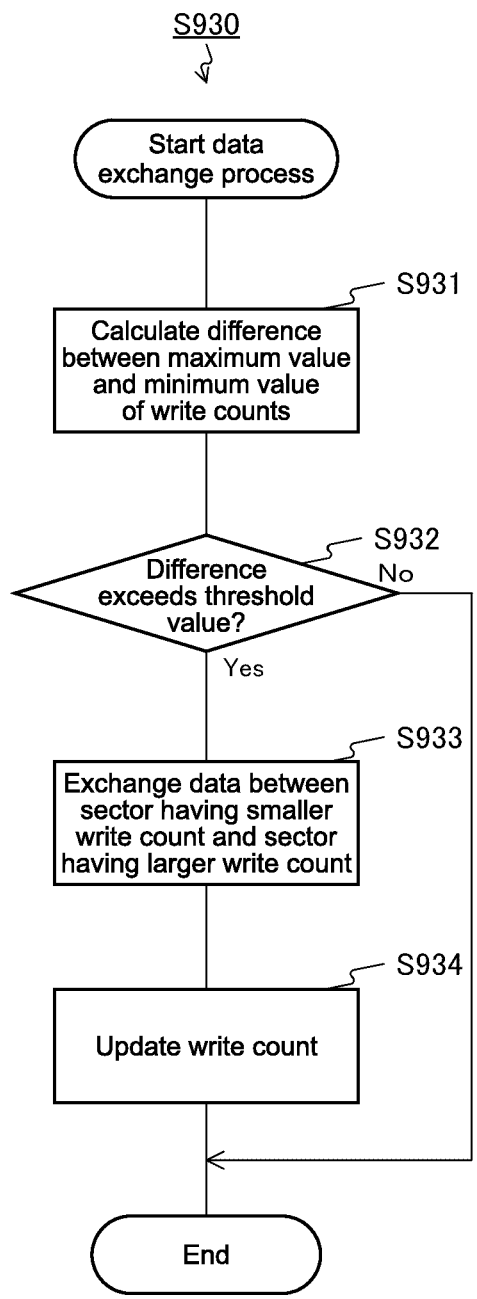
FIG. 14 is a flowchart showing an example of a data exchange process in the first embodiment.

FIG. 14 is a flowchart showing an example of the data exchange process in the first embodiment. The control processing unit 320 obtains a maximum value and a minimum value of the write counts of each of the sectors to which the data is written and calculate a difference therebetween (Step S931). The control processing unit 320 determines whether the difference calculated exceeds the predetermined threshold value W1 or not (Step S932).

When the difference exceeds the threshold value W1 (Yes in Step S932), the control processing unit 320 exchanges data between the sector to which the data is written the larger number of times and the sector to which the data is written the smaller number of times (Step S933). The control processing unit 320 updates the write counts of the sectors between which the data is exchanged (Step S934).

When the difference is less than the threshold value W1 (No in Step S932), or after Step S934, the control processing unit 320 terminates the data exchange process.

In this way, according to the first embodiment of the present disclosure, the memory controller 300 can write the data to the sector having the higher write priority determined in accordance with the degrees of consumption and the temperatures. Because the degree of consumption due to the write process executed is changed depending on the temperature, the data is written in accordance with the temperature and the degree of consumption up to that time, thereby making it possible to appropriately level the degrees of consumption of the sectors.

First Modified Example

In the first embodiment, the memory controller 300 performs the data exchange process each time the write process is performed. However, as the write process execution frequency is increased, the execution frequency of the data exchange process is also increased. Therefore, the memory cells may be increasingly consumed. In view of this, the memory controller 300 may perform the data exchange process with a certain time period. A first modified example is different from the first embodiment in that the memory controller 300 performs the data exchange process with the certain time period.

Figure 15:
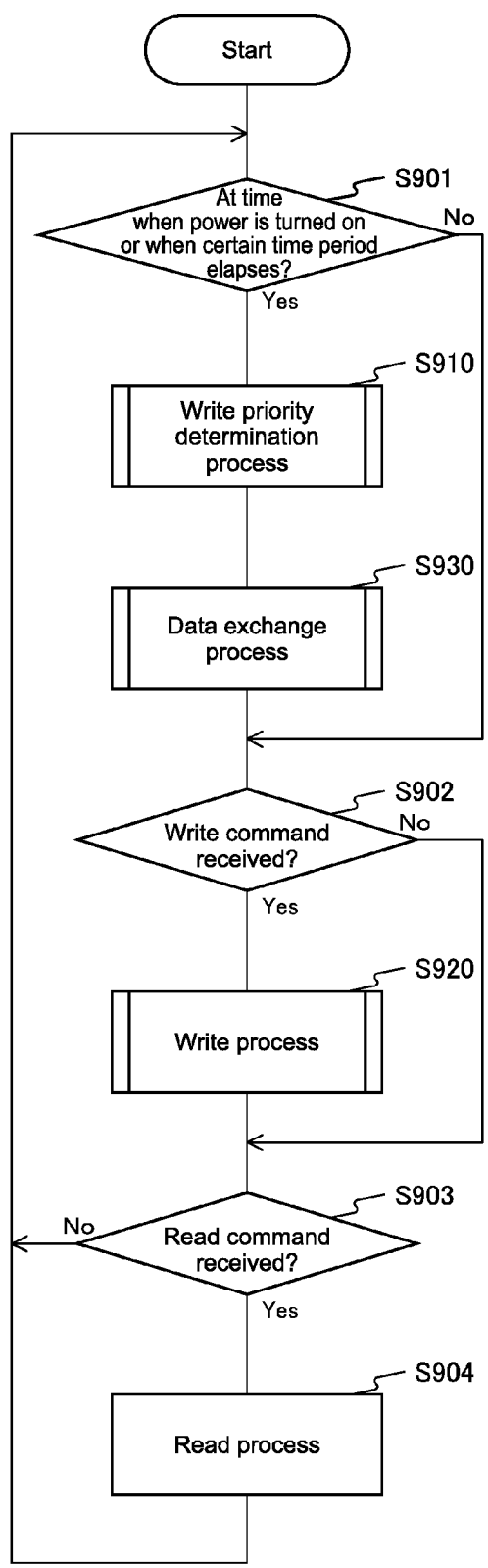
FIG. 15 is a flowchart showing an example of the operation of the memory controller in a first modified example of the first embodiment.

FIG. 15 is a flowchart showing an example of the operation of the memory controller 300 in the first modified example. The operation of the memory controller 300 in the first modified example is different from that in the first embodiment in that a data exchange process (Step S930) is performed not after the write process (Step S920) but with a certain time period. Specifically, after the certain time period elapses (Yes in Step S901), the memory controller 300 performs the write priority determination process (Step S910) and the data exchange process (Step S930).

Second Modified Example

In the first embodiment, the memory controller 300 performs the write priority determination process and the access control process such as the write process and the read process in order, but the write priority determination process and the access control process may be executed in parallel. A second modified example is different from the first embodiment in that the memory controller 300 executes the write priority determination process and the access control process in parallel.

Figure 16:
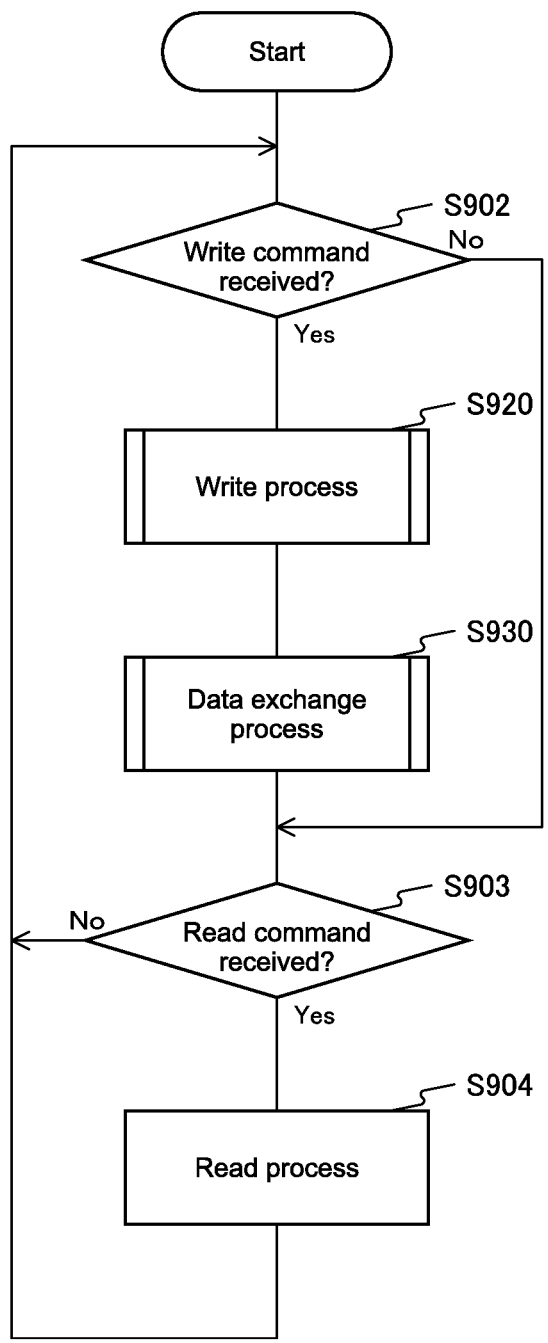
FIG. 16 is a flowchart showing an example of the operation of the control processing unit in a second modified example of the first embodiment.
Figure 17:
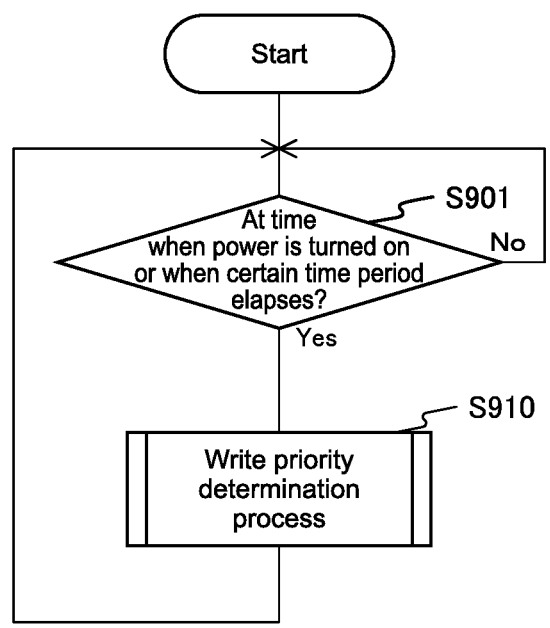
FIG. 17 is a flowchart showing an example of the operation of a write priority determination unit in the second modified example of the first embodiment.

Specifically, the control processing unit 320 performs the access control process and the data exchange process as exemplified in FIG. 16, while the write priority determination process 315 performs the write priority determination with the certain time period as exemplified in FIG. 17.

FIG. 16 is a flowchart showing an example of the operation of the control processing unit 320 in the second modified example. The operation is the same as that of the memory controller 300 shown in FIG. 11 except the point that Steps S901 and S910 are not carried out.

FIG. 17 is a flowchart showing an example of the operation of the write priority determination unit 315 in the second modified example. The operation is the same as the operation of the memory controller 300 shown in FIG. 11 except the point that Steps S902, S903, S904, S920, and S930 are not performed.

It should be noted that in the first modified example, the control processing unit 320 may perform the access control process and the data exchange process in parallel with the priority determination process as in the second modified example.

Third Modified Example

In the first embodiment, the memory controller 300 sets the write priority to be lower, as the temperature is increased. Conversely, the write priority may be set to be higher, as the temperature is increased. A third modified example is different from the first embodiment in that the memory controller 300 sets the write priority to be higher, as the temperature is increased.

Specifically, the write priority determination unit 315 calculates the write priority by using the following expression 2 instead of the expression 1.

$$P_1' = T^\alpha / N \quad \text{Expression 2}$$

where $P_1'$ represents a write priority of a target sector the priority of which is to be obtained, and $\alpha$ represents a predetermined coefficient determined by a characteristic of the memory cell. In addition, T represents a temperature of the cell array including the target sector, and N represents the write count of the target sector. The unit of T is degree C. (° C.), for example.

From the expression 2, as the degree of consumption (write count, for example) is increased, the write priority becomes lower. As the temperature is increased, the write priority becomes higher. Here, as the temperature of the memory cell is increased, a time period necessary for one write (so-called latency) becomes shorter. Therefore, the expression 2 is used to set the write priority to be higher, as the temperature is increased, with the result that the degrees of consumption are leveled, and the latency for the write can be shortened (in other words, increase an access speed).

It should be noted that the write priority determination unit 315 may determine the write priority from an expression other than the expression 2, as long as it is possible to obtain such a write priority as to be lower as the write count is increased and to be higher as the temperature is increased. In addition, the write priority determination unit 315 is configured to calculate the write priority by using the expression, but the configuration thereof is not limited to this. For example, the write priority is determined in advance by using the expression 2 or the like for each combination of the write count and the temperature, a table in which the combinations and the write priorities are associated with each other is held in the write priority determination unit 315, and the write priority may be obtained by referring to the table.

In addition, when the temperature exceeds a temperature threshold value $T_{max}$ at which it is assured that the memory cell satisfies a prescribed characteristic and operates safely, errors more than a tolerance are caused in the memory cell when the data is written, and the data may not be written normally. In view of this, in the case where the temperature of cell array exceeds $T_{max}$, the write priority determination unit 315 may minimize the priority of the sectors of the cell array. Specifically, the write priority determination unit 315 uses the following expression 3 instead of the expression 2 to calculate the write priority. As a result, this process prevents that the data is not normally written due to overheat.

$$P_1' = 0 \, (T > T_{max})$$

$$P_1' = T^\alpha / N \, (T \leq T_{max}) \quad \text{Expression 3}$$

Fourth Modified Example

In the first embodiment, the memory controller 300 performs the data exchange process irrespective of the temperature of the cell array, but can perform the data exchange process in the cell array at a predetermined temperature or less. A fourth modified example is different from the first embodiment in that the memory controller 300 performs the data exchange process in the cell array at the predetermined temperature or less.

Figure 18:
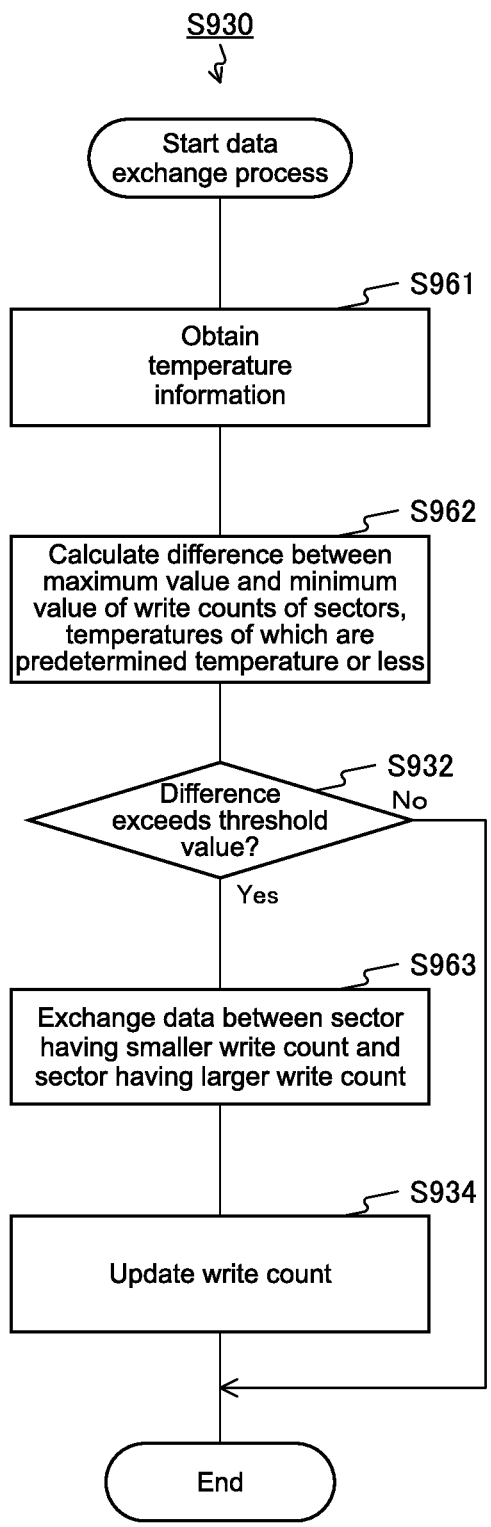
FIG. 18 is a flowchart showing an example of a data exchange process in a fourth modified example of the first embodiment.

FIG. 18 is a flowchart showing an example of the data exchange process in the fourth modified example. The data exchange process in the fourth modified example is different from that in the first embodiment shown in FIG. 14 in that Steps S961, S962, and S963 are performed instead of Steps S931 and S933.

The control processing unit 320 obtains the temperature information of the cell arrays from the temperature information holding unit 312 and holds an identification number of the cell array at the predetermined temperature or less (Step S961). By referring to the identification number held, the control processing unit 320 obtains a maximum value and a minimum value of the write counts in the sectors in the cell array corresponding to the identification number to calculate a difference therebetween (Step S962). Then, the control processing unit 320 determines whether the difference calculated exceeds the predetermined threshold value W1 or not (Step S932). When the difference exceeds the threshold value W1 (Yes in Step S932), the control processing unit 320 refers to the identification number held to exchange the data between the sector to which the write is performed the larger number of times and the sector to which the write is performed the smaller number of times in the cell array corresponding to the identification number (Step S963). Then, the control processing unit 320 performs the process of Step S934.

As described above, as the temperature is increased, the degree of consumption becomes higher. Therefore, by performing the data exchange process for the memory cells excluding the memory cell, the temperature of which is higher than the predetermined temperature, the degrees of consumption are more appropriately leveled.

Fifth Modified Example

In the first embodiment, the memory controller 300 does not initialize the write priority when the power is turned on. However, when the power is turned on, the write priority may be initialized to a prescribed value (for example, 0). A fifth modified example is different from the first embodiment in that the memory controller 300 initializes the write priority when the power is turned on.

Figure 19:
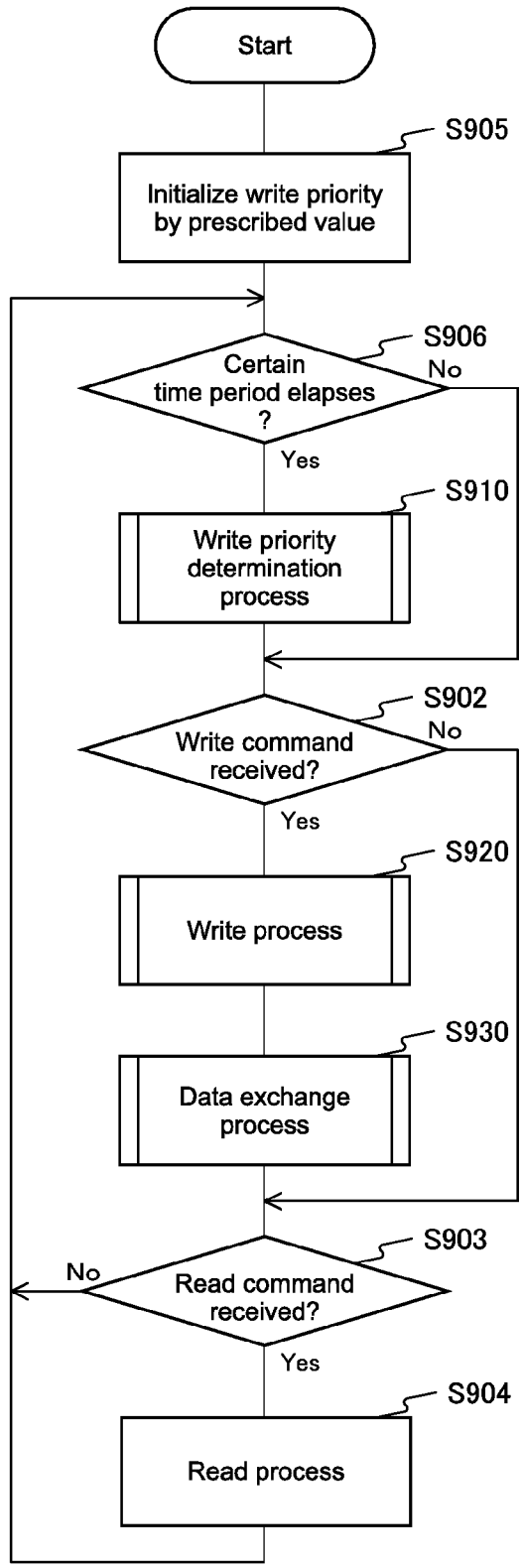
FIG. 19 is a flowchart showing an example of the operation of the memory controller in a fifth modified example of the first embodiment.

FIG. 19 is a flowchart showing an example of the operation of the memory controller in the fifth modified example. The operation of the memory controller 300 in the fifth modified example is different from that in the first embodiment shown in FIG. 11 in that Steps S905 and S906 are performed instead of Steps S901.

When the power is turned on, the memory controller 300 initializes the write priority of the sectors by a prescribed value (Step S905). Then, the memory controller 300 determines whether a certain time period elapses or not from when a preceding write priority determination process is executed or when the initialization is performed (Step S906). When the certain time period elapses (Yes in Step S906), the memory controller 300 performs a process of Step S910. When the certain time period does not elapse (No in Step S906), the memory controller 300 performs a process of Step S902.

It should be noted that in Step S905, the memory controller 300 sets the prescribed value as the initial value, but may set the write priority finally determined before the power is turned off as the initial value. In this case, for example, the memory controller 300 is further provided with a write priority storage unit formed of a non-volatile memory. When the power is turned off, the write priorities held in the write priority holding unit 316 are read and stored in the write priority storage unit. Then, when the power is turned on, the memory controller 300 reads the write priority from the write priority storage unit and causes the write priority holding unit 316 to hold the write priority as the initial value.

Sixth Modified Example

In the first embodiment, the memory controller 300 does not initialize the write priority when the power is turned on. However, when a predetermined temperature condition is satisfied at a time of turning on the power, the write priority may be initialized. The sixth modified example is different from the first embodiment in that the memory controller 300 initializes the write priority when the predetermined temperature condition is satisfied at a time of turning on the power.

Figure 20:
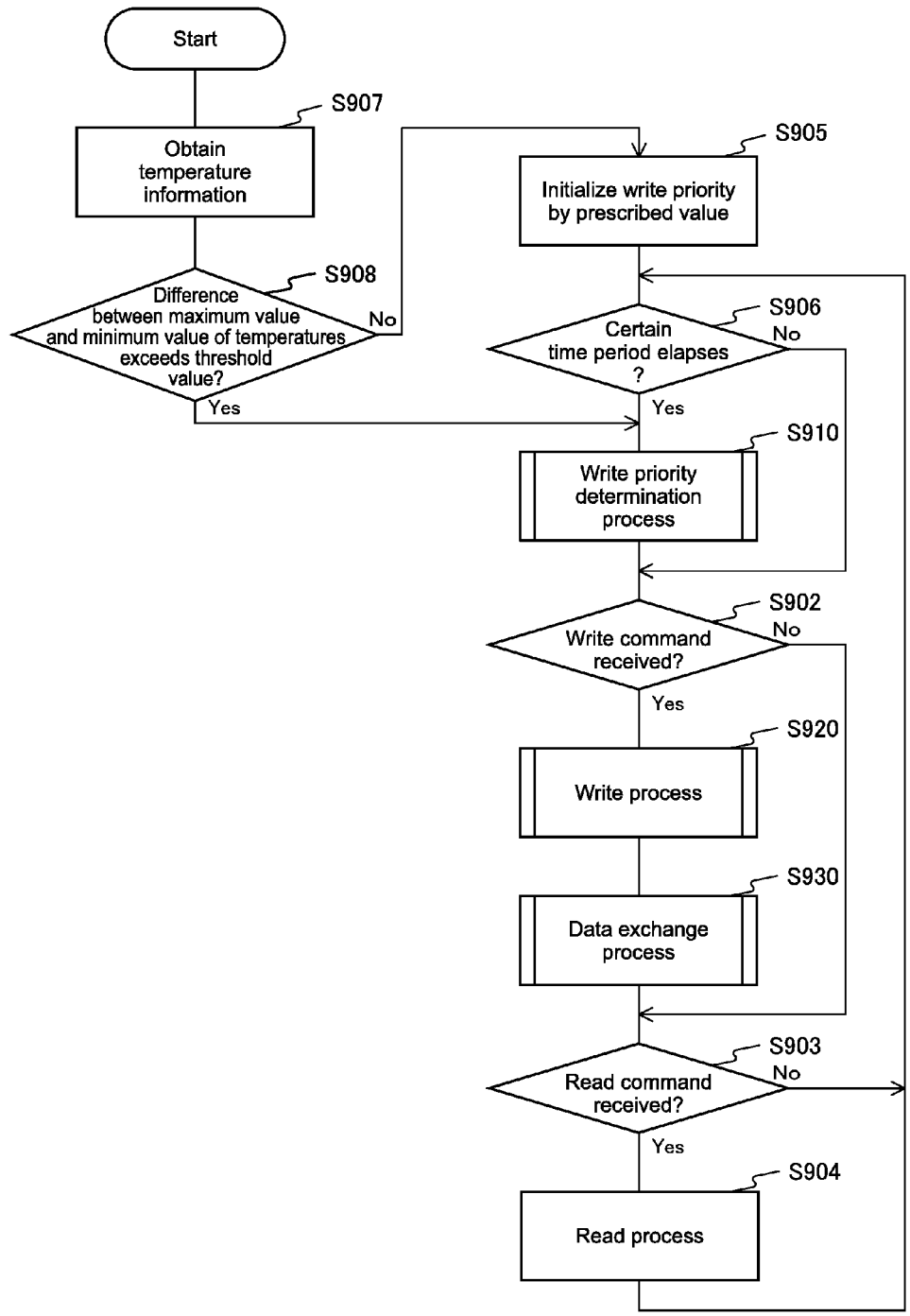
FIG. 20 is a flowchart showing an example of the operation of the memory controller in a sixth modified example of the first embodiment.

FIG. 20 is a flowchart showing an example of the operation of the memory controller 300 in the sixth modified example. The operation of the memory controller 300 in the sixth modified example is different from that in the first embodiment shown in FIG. 11 in that Steps S905, S906, S907, and S908 are performed instead of Step S901.

When the power is turned on, the memory controller 300 obtains the temperature information of each cell array from the temperature information holding unit 312 (Step S907). The write priority determination unit 315 obtains a characteristic amount (for example, difference between a maximum value and a minimum value) of the temperature of the cell array and determines whether the difference exceeds the threshold value T1 or not (Step S908). If the difference does not exceed the threshold value T1 (No in Step S908), the memory controller 300 initializes the write priority of each sector by a prescribed value (Step S905). Then, the memory controller 300 determines whether a certain time period elapses or not from when the preceding write priority determination process is executed or when the initialization is performed (Step S906).

In the case where the difference exceeds the threshold value T1 (Yes in Step S908) or the certain time period elapses (Yes in Step S905), the memory controller 300 performs the process of Step S910. In the case where the certain time period does not elapse (No in Step S905), the memory controller 300 performs the process of Step S902.

2. Second Embodiment

Example of Structure of Memory Controller

In the first embodiment, the assumption is made that the temperature is constant in the write processes, and the write count is used as the degree of consumption as it is. However, in actuality, the temperature may differ in the write processes. When different temperatures are generated in the write processes, the degree of consumption differs from one write process to another. Therefore, for each write process, it is desirable that the degree of consumption is obtained in accordance with the temperature at that time. A second embodiment is different from the first embodiment in that the memory controller 300 obtains the degree of consumption for each write process in accordance with the temperature at that time.

Figure 21:
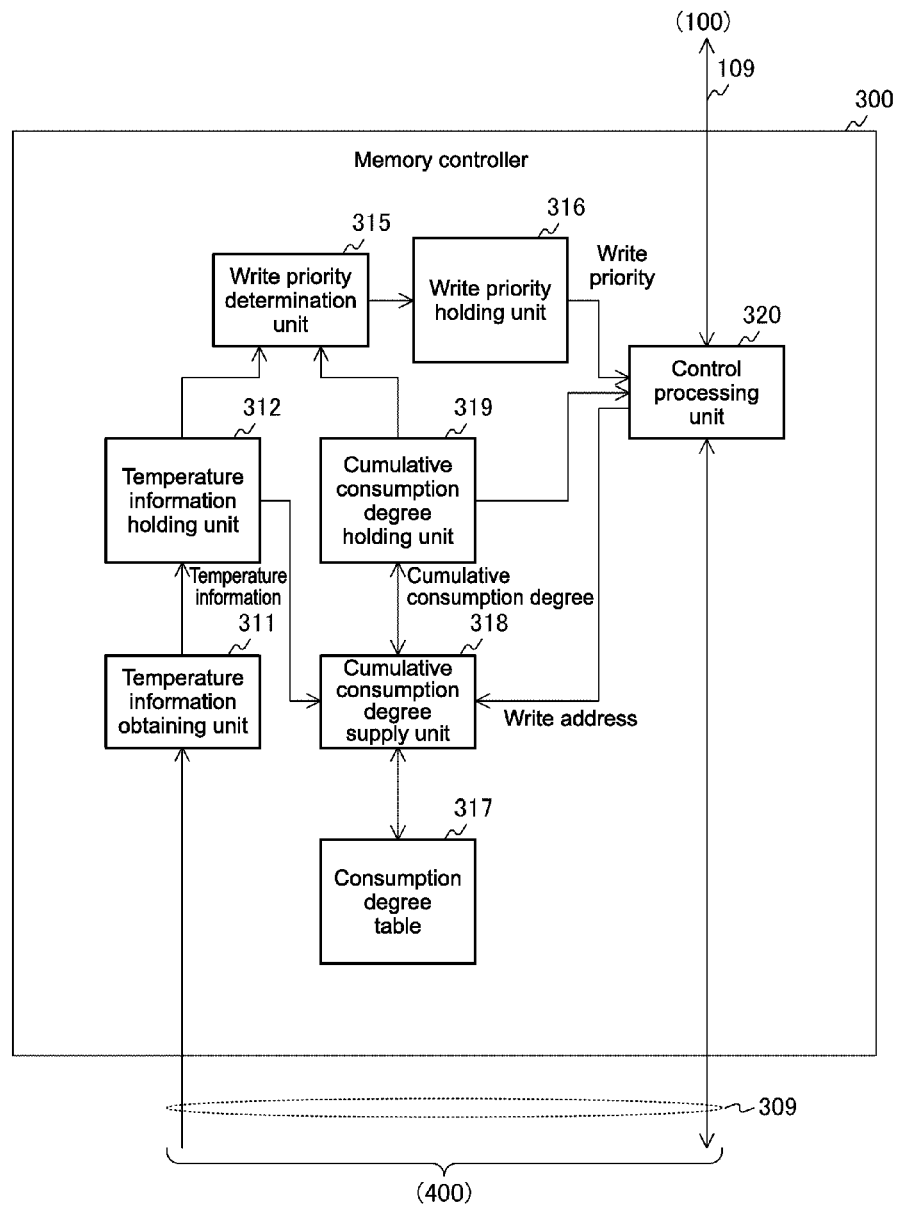
FIG. 21 is a block diagram showing an example of the functional structure of the memory controller according to a second embodiment of the present disclosure.

FIG. 21 is a block diagram showing an example of the functional structure of the memory controller 300 according to the second embodiment. The second embodiment is different from the first embodiment in that the memory controller 300 is provided with a consumption degree table 317, a cumulative consumption degree supply unit 318, and a cumulative consumption degree holding unit 319, instead of the write count supply unit 313 and the write count holding unit 314.

The consumption degree table 317 holds the degrees of consumption by one write process for each temperature. As described above, in the memory cells, as the temperature is increased, the life thereof becomes shorter. The degree of consumption by one write process tends to be higher. On the basis of the tendency, for example, the lives for each temperature are determined in advance. As the life is shorter, a higher value of the degree of consumption by one write process is held in the consumption degree table. For example, a value proportional to a reciprocal of the life at a given temperature is held as the degree of consumption at the temperature.

The cumulative consumption degree supply unit 318 supplies a cumulative value of the degrees of consumption in the write processes as the cumulative consumption degree for each sector. When receiving the write address from the control processing unit 320, the cumulative consumption degree supply unit 318 reads a temperature of the sector corresponding to the write address from the temperature information holding unit 312. Then, the cumulative consumption degree supply unit 318 obtains the degree of consumption corresponding to the read temperature from the consumption degree table 317. Then, the cumulative consumption degree supply unit 318 calculates, as a new cumulative consumption degree, a value obtained by adding the obtained consumption degree to the cumulative consumption degree of the sector corresponding to the write address and causes the cumulative consumption degree holding unit 319 to hold the new cumulative consumption degree. Further, each time the write address is received, the cumulative consumption degree supply unit 318 updates a total degree of consumption, which is the cumulative value of the degrees of consumption in the memory system 200 from the time point when the write priority is finally calculated to the current time point, and causes the cumulative consumption degree holding unit 319 to hold the value updated. The cumulative consumption degree holding unit 319 holds the total degree of consumption and the cumulative consumption degree for each sector.

It should be noted that the cumulative consumption degree supply unit 318 is an example of a consumption degree supply unit described in the scope of the appended claims. Further, the cumulative consumption degree supply unit 318 is configured to obtain the degree of consumption in accordance with the temperature from the consumption degree table 317, but the configuration thereof is not limited to this. For example, the cumulative consumption degree supply unit 318 may define a predetermined function Y(X), where X represents the temperature, and Y represents the degree of consumption, and use the function Y(X) to calculate the degree of consumption from the temperature. Values of coefficients of Y(X) are determined by a functional approximation that determines such a value that an error with a plurality of (X, Y) obtained becomes the smallest, for example.

The write priority determination unit 315 in the second embodiment calculates, as the write priority, a value in accordance with the cumulative consumption value and the temperature for each sector. For example, the write priority determination unit 315 determines the write priority for each sector by using the following expression 4. In addition, in the case where the write priority is calculated, the write priority determination unit 315 updates the total consumption degree in the cumulative consumption degree holding unit 319 to an initial value (for example, 0).

$$P_2 = 1/T^{\alpha} * W \qquad \text{Expression 4}$$

where, $P_2$ represents the write priority of the target sector the priority of which is to be obtained, and a represents a predetermined coefficient defined by the characteristic of the memory cell. Further, T represents the temperature of the cell array including the target sector, and W represents the cumulative degree of consumption of the target sector.

As described above, the degree of consumption of the memory cell by one write process is not constant, and as the temperature is increased, the degree of consumption becomes higher. Therefore, by obtaining the degree of consumption in accordance with the temperature each time the write process is performed, the memory controller 300 can exactly obtain the degree of consumption by the write processes up to the current time.

It should be noted that, as long as the value of the write priority becomes lower, as the cumulative consumption degree is increased, and as long as the value of the write priority becomes lower, as the temperature is increased, the write priority determination unit 315 may determine the write priority from an expression other than the expression 4. The write priority determination unit 315 is configured to calculate the write priority by using the expression, but the configuration thereof is not limited to this. For example, the expression 4 or the like is used to calculate the write priority for each combination of the cumulative consumption degree and the temperature in advance, and a table in which the combinations and the write priorities are associated with each other is held in the write priority determination unit 315. By referring to the table, the write priority may be obtained.

FIG. 22 is a diagram showing an example of the consumption degree table 317 in the second embodiment. The consumption degree table 317 holds, for each temperature, a reciprocal (normalized value thereof as necessary) of a write life at each temperature as the degree of consumption in one write process. The normalization is performed with a write life at a certain temperature as a reference, for example.

The case is considered in which the life of the memory cell at 20° C. is 1,000,000 times, and the life of the memory cell at 30° C. is 800,000 times. In this case, for example, the life at 20° C. is set as a reference. The reciprocal of each of the lives is multiplied by the life at 20° C., thereby performing the normalization. As a result, the reciprocal of 1,000,000 is normalized to obtain 1.00 and hold the value as the degree of consumption at 20° C., and the reciprocal of 800,000 is normalized to obtain 1.25 and hold the value as the degree of consumption at 30° C.

FIG. 23 is a diagram showing an example of data held in the cumulative consumption degree holding unit 319 in the second embodiment. In the cumulative consumption degree holding unit 319, the cumulative consumption degrees are held for each sector in the non-volatile memory chip 400. For example, in the case where the number of sectors in the memory system 200 is 4m*n, 4m*n cumulative consumption degrees are held. Further, in the cumulative consumption degree holding unit 319, the total consumption degree is held.

Figure 24:
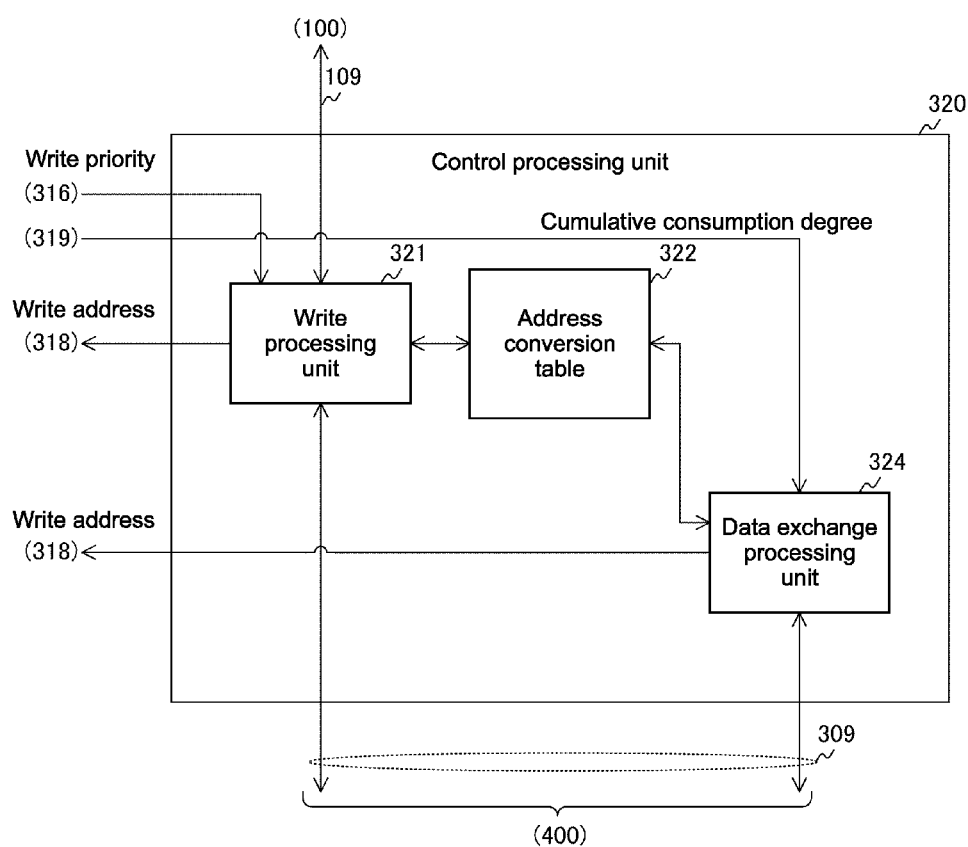
FIG. 24 is a block diagram showing an example of the structure of the control processing unit in the second embodiment.

FIG. 24 is a block diagram showing an example of the structure of the control processing unit 320 in the second embodiment. The structure of the control processing unit 320 in the second embodiment is different from that in the first embodiment in that the control processing unit 320 is provided with a data exchange processing unit 324 instead of the data exchange processing unit 323.

The structure of the data exchange processing unit in the second embodiment is different from that in the first embodiment in that the data exchange processing unit 324 obtains the cumulative consumption degree, instead of the write count, for each sector and determines whether the data exchange process is performed or not depending on whether a difference between a maximum value and a minimum value thereof exceeds a predetermined threshold value W2 or not.

Figure 25:
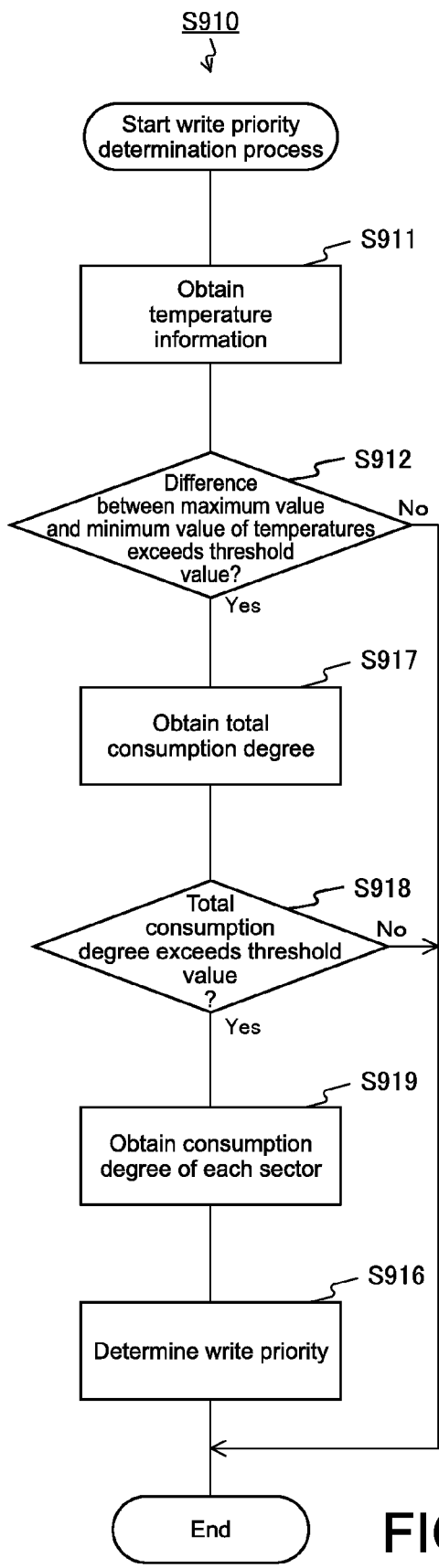
FIG. 25 is a flowchart showing an example of a write priority determination process in the second embodiment.

FIG. 25 is a flowchart showing an example of a write priority determination process in the second embodiment. The write priority determination process in the second embodiment is different from that in the first embodiment in that Steps S917, S918, and S919 are performed instead of Steps S913, S914, and S915.

After obtaining the temperature information (Step S911), the write priority determination unit 315 determines whether the characteristic amount (for example, difference between a maximum value and a minimum value) of the temperature of the cell array exceeds a threshold value T2 or not (Step S912). When the difference exceeds the threshold value T2 (Yes in Step S912), the write priority determination unit 315 obtains a total degree of consumption in the memory system 200 from the time point when the write priority is finally calculated to the current time point from the cumulative consumption degree holding unit 319 (Step S917). Then, the write priority determination unit 315 determines whether the total consumption degree exceeds a threshold value W2' or not (Step S918). In the case where the total consumption degree exceeds the threshold value W2' (Yes in Step S918), the write priority determination unit 315 obtains the cumulative consumption degrees of the sectors from the cumulative consumption degree holding unit 319 (Step S919). The write priority determination unit 315 uses the expression 4 or the like to determine the write priority for each sector in accordance with the temperatures and the cumulative consumption degrees and cause the write priority holding unit 316 to hold the write priorities determined. Further, the write priority determination unit 315 sets the total consumption degree to an initial value (for example, 0) (Step S916). By performing Steps S912 and S918, it is possible to reduce the frequency of calculating the write priorities. In the case where the difference is less than the threshold value T2 (No in Step S918), or after Step S919, the write priority determination unit 315 terminates the write priority determination process.

It should be noted that, in the case where the characteristic amount (for example, difference) exceeds the threshold value T2, and the total consumption degree exceeds the threshold value W2', the write priority determination unit 315 calculates the write priority. However, the write priority determination unit 315 may calculate the write priority, when the characteristic amount exceeds the threshold value T2, or when the total consumption degree exceeds the threshold value W2'. Further, the write priority determination unit 315 may not necessarily perform Steps S912 and S918. The write priority determination unit 315 may perform one of Steps S912 and S918 or may perform neither Step S912 nor Step S918. Here, in the case where Step S918 in which the total consumption degree is compared with the threshold value is not performed, Step S917 for obtaining the total consumption degree also becomes unnecessary.

Figure 26:
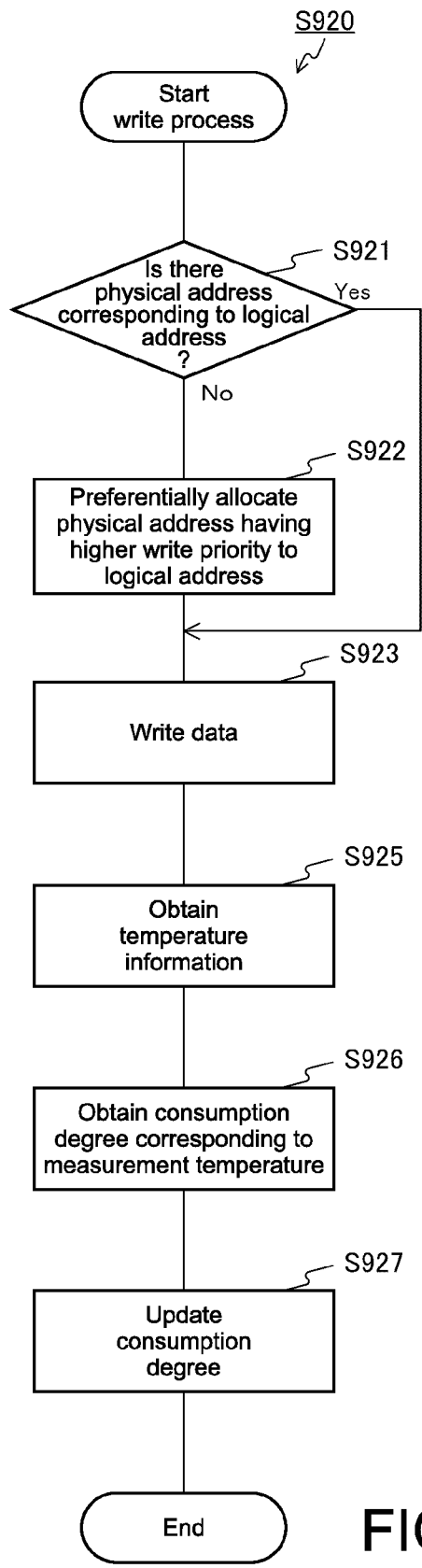
FIG. 26 is a flowchart showing an example of a write process in the second embodiment.

FIG. 26 is a flowchart showing an example of a write process in the second embodiment. The write process in the second embodiment is different from that in the first embodiment in that Steps S925 to S927 are performed instead of Step S924. After writing data (Step S923), the control processing unit 320 obtains the temperature of the sector, which is the data write destination, from the temperature information holding unit 312 (Step S925). The control processing unit 320 obtains the degree of consumption corresponding to the obtained temperature from the consumption degree table 317 (Step S926). Then, the control processing unit 320 informs the cumulative consumption degree supply unit 318 of the physical address to which the data is written. The cumulative consumption degree supply unit 318 updates the cumulative consumption degree of the physical address which is held in the cumulative consumption degree holding unit 319. Further, the cumulative consumption degree supply unit 318 updates the total consumption degree held in the cumulative consumption degree holding unit 319 (Step S927). After Step S927, the control processing unit 320 terminates the write process.

Figure 27:
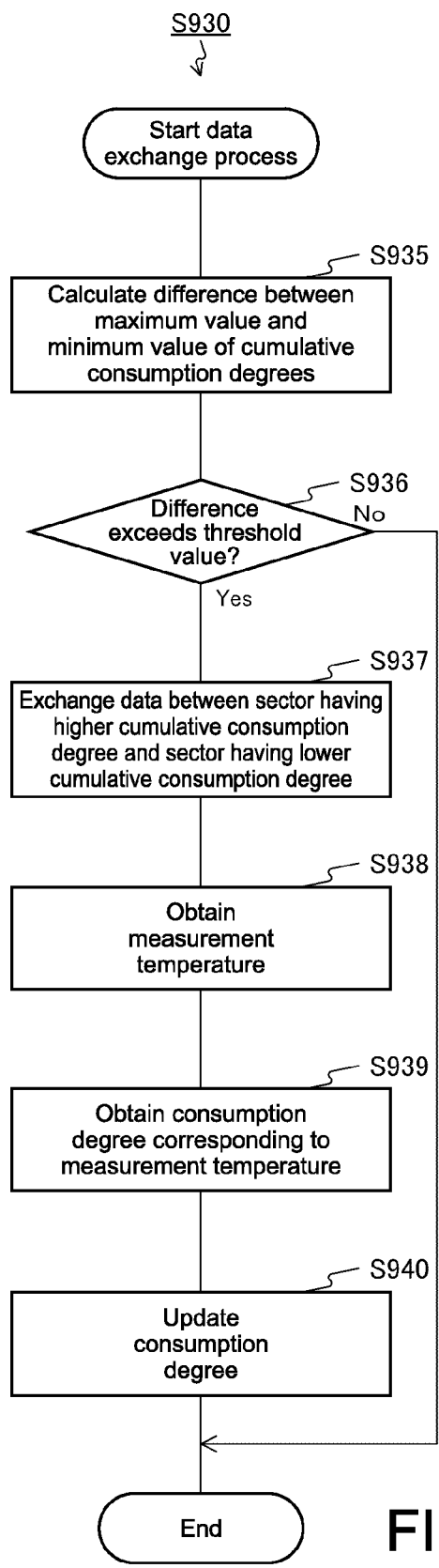
FIG. 27 is a flowchart showing an example of a data exchange process in the second embodiment.

FIG. 27 is a flowchart showing an example of the data exchange process in the second embodiment. The control processing unit 320 determines a maximum value and a minimum value of the cumulative consumption degrees of the sectors and calculates a difference therebetween (Step S935). The control processing unit 320 determines whether the calculated difference exceeds the predetermined threshold value W2 or not (Step S936).

When the difference exceeds the threshold value W2 (Yes in Step S936), the control processing unit 320 exchanges data between the sector having a larger cumulative consumption degree and the sector having a smaller cumulative consumption degree (Step S937). The control processing unit 320 obtains the temperatures of the sectors between which the data is exchanged from the temperature information holding unit 312 (Step S938). The control processing unit 320 obtains the degrees of consumption corresponding to the respective temperatures obtained (Step S939). On the basis of the degrees of consumption obtained, the control processing unit 320 updates the cumulative consumption degrees of the sectors between which the data is exchanged (Step S940).

When the difference is less than the threshold value W2 (No in Step S936), or after Step S940, the control processing unit 320 terminates the data exchange process.

It should be noted that, to the second embodiment, it is also possible to apply the first to sixth modified examples as in the first embodiment. In the case where the fourth modified example shown in FIG. 18 is applied to the data exchange process in the second embodiment shown in FIG. 27, the temperature information is already obtained in Step S961, so Step S938 can be omitted.

As described above, according to the second embodiment in the present disclosure, the memory controller 300 can obtain, as the degree of consumption, the value in accordance with the temperature at which the write process is performed. Therefore, even in the case where the different temperatures are generated for each write process, it is possible to exactly obtain the degrees of consumption up to the current time. As a result, it is possible to appropriately level the degrees of consumption of the memory cells.

It should be noted that the above embodiments are examples for implementing the present technology, and the items in the embodiments and the items specifying the present disclosure in the scope of the appended claims have correspondence relationship. Similarly, the items specifying the present disclosure in the scope of the appended claims and items having the same names in the embodiments of the present disclosure have correspondence relationship. However, the present disclosure is not limited to the above embodiments and can be implemented by variously modifying the embodiments without departing the gist of the present disclosure.

Further, the process procedures described in the above embodiments may be handled as a method having the series of the procedures, and may be handled as a program for causing a computer to execute the series of the procedures or a recording medium that stores the program. As the recording medium, for example, a CD (compact disc), an MD (mini-disc), a DVD (digital versatile disk), a memory card, a Blu-ray Disc (registered trademark), or the like can be used.

It should be noted that the present disclosure can take the following configurations.

(1) A memory control apparatus, including:
a temperature obtaining unit configured to obtain, in a memory having a plurality of measurement areas each including a plurality of unit areas, temperatures measured in the plurality of measurement areas;
a priority determination unit configured to determine a priority for each unit area in accordance with a degree of consumption and the temperature of the measurement area including the unit areas, the degree of consumption being a degree of consumption of the unit area which is caused by a write process performed; and
a write processing unit configured to preferentially perform the write process with respect to the unit area having a higher priority as a data write destination.

(2) The memory control apparatus according to Item (1), in which
the priority determination unit determines a value of the priority to be lower, as the degree of consumption is increased, and to be lower, as the temperature is increased.

(3) The memory control apparatus according to Item (1), in which
the priority determination unit determines a value of the priority to be lower, as the degree of consumption is increased, and to be higher, as the temperature is increased.

(4) The memory control apparatus according to Item (3), in which
the priority determination unit determines the priority to be a predetermined value in the unit area included in the measurement area, the temperature of which exceeds a predetermined threshold value.

(5) The memory control apparatus according to any one of Items (1) to (4), in which
the priority determination unit obtains a characteristic amount on the basis of the temperature of the measurement area and determines the priority when the characteristic amount exceeds a predetermined amount.

(6) The memory control apparatus according to any one of Items (1) to (5), in which
the priority determination unit obtains a characteristic amount on the basis of the temperature of the measurement area when a power is turned on, and determines the priority to be a predetermined value when the characteristic amount is equal to or smaller than a predetermined amount.

(7) The memory control apparatus according to any one of Items (1) to (6), further including
a consumption degree supply unit configured to supply, as the degree of consumption, a value obtained in accordance with the temperature of the unit area at a time when the write processing unit performs the write process to the priority determination unit.

(8) The memory control apparatus according to Item (7), further including
a data exchange processing unit configured to perform a data exchange process of exchanging data in the unit area, the degree of consumption of which is higher, for data in the unit area, the degree of consumption of which is lower, out of the plurality of unit areas, to level the degrees of consumption in the plurality of unit areas.

(9) The memory control apparatus according to Item (8), in which
the data exchange processing unit determines whether a difference between a maximum value and a minimum value of the degrees of consumption of the plurality of unit areas exceeds a predetermined threshold value or not, each time the degree of consumption is obtained, and performs the data exchange process when the difference exceeds the predetermined threshold value.

(10) The memory control apparatus according to Item (8), in which
the data exchange processing unit performs the data exchange process in the measurement area, the temperature of which is equal to or less than a predetermined temperature.

(11) The memory control apparatus according to any one of Items (1) to (9), in which
the priority determination unit determines the priority, each time a certain time period elapses.

(12) The memory control apparatus according to Item (11), in which
the priority determination unit determines the priority when a total write count exceeds a predetermined count, the total write count being a write count with respect to the memory from when a preceding determination of the priority is performed until when the certain time period elapses.

(13) The memory control apparatus according to Item (11), in which
the priority determination unit determines the priority when a total consumption degree exceeds a predetermined value, the total consumption degree being the degree of consumption of the memory from when a preceding determination of the priority is performed until when the certain time period elapses.

(14) The memory control apparatus according to any one of Items (1) to (13), in which
the plurality of unit areas each have a physical address allocated thereto, and
when writing data to a logical address to which the physical address is unallocated is ordered, the write processing unit preferentially allocates the physical address of the unit area having a higher priority to the logical address and sets the physical address allocated as the data write destination.

(15) A memory system, including:
a memory having a plurality of measurement areas each including a plurality of unit areas;
a temperature obtaining unit configured to obtain temperatures measured in the plurality of measurement areas;
a priority determination unit configured to determine a priority for each unit area in accordance with a degree of consumption and the temperature of the measurement area including the unit areas, the degree of consumption being a degree of consumption of the unit area which is caused by a write process performed; and
a write processing unit configured to preferentially perform the write process with respect to the unit area having a higher priority as a data write destination.

(16) An information processing system, including:
a host computer configured to order to perform a data write process;
a memory having a plurality of measurement areas each including a plurality of unit areas;
a temperature obtaining unit configured to obtain temperatures measured in the plurality of measurement areas;

a priority determination unit configured to determine a priority for each unit area in accordance with a degree of consumption and the temperature of the measurement area including the unit areas, the degree of consumption being a degree of consumption of the unit area which is caused by a write process performed; and a write processing unit configured to preferentially perform the ordered write process with respect to the unit area having a higher priority as a data write destination.

(17) A memory control method, including:

obtaining, in a memory having a plurality of measurement areas each including a plurality of unit areas, temperatures measured in the plurality of measurement areas by a temperature obtaining unit;

determining a priority for each unit area in accordance with a degree of consumption and the temperature of the measurement area including the unit areas by a priority determination unit, the degree of consumption being a degree of consumption of the unit area which is caused by a write process performed; and preferentially performing the write process with respect to the unit area having a higher priority as a data write destination by a write processing unit.

It should be understood by those skilled in the art that various modifications, combinations, sub-combinations and alterations may occur depending on design requirements and other factors insofar as they are within the scope of the appended claims or the equivalents thereof.

What is claimed is:

1. A memory control apparatus, comprising:
    a temperature obtaining unit configured to obtain, in a memory having a plurality of measurement areas each including a plurality of unit areas, temperatures measured in the plurality of measurement areas;
    a priority determination unit configured to determine a priority for each unit area of the plurality of unit areas in accordance with a degree of consumption and a difference between a maximum temperature and a minimum temperature among the measured temperatures of a corresponding measurement area, wherein the degree of consumption is a degree of consumption of the unit area caused by a write process performed on the unit area; and
    a write processing unit configured to preferentially perform the write process with respect to a unit area having a higher priority than other of the plurality of unit areas as a data write destination.

2. The memory control apparatus according to claim 1, wherein the priority determination unit determines a value of the priority to be loweras the degree of consumption is increased, and
    wherein the value of the priority is determined to be lower as the temperature is increased.

3. The memory control apparatus according to claim 1, wherein the priority determination unit determines a value of the priority to be lower as the degree of consumption is increased, and
    wherein the value of the priority is determined to be higher as the temperature is increased.

4. The memory control apparatus according to claim 3, wherein the priority determination unit determines the priority to be a predetermined value in the unit area included in the corresponding measurement area, the temperature of which exceeds a predetermined threshold value.

5. The memory control apparatus according to claim 1, wherein the priority determination unit obtains a characteristic amount based on a temperature of the corresponding measurement area and determines the priority when the characteristic amount exceeds a predetermined amount.

6. The memory control apparatus according to claim 1, wherein the priority determination unit obtains a characteristic amount based on temperature of the corresponding measurement area when a power is turned on, and determines the priority to be a predetermined value when the characteristic amount is equal to or smaller than a predetermined amount.

7. The memory control apparatus according to claim 1, further comprising a consumption degree supply unit configured to supply to the priority determination unit, as the degree of consumption, a value obtained in accordance with the temperature of the unit area at a time when the write processing unit performs the write process.

8. The memory control apparatus according to claim 7, further comprising a data exchange processing unit configured to perform a data exchange process of exchanging data in a unit area, the degree of consumption of which is higher, for data in another unit area, the degree of consumption of which is lower, out of the plurality of unit areas, to level the degrees of consumption in the plurality of unit areas.

9. The memory control apparatus according to claim 8, wherein the data exchange processing unit determines whether a difference between a maximum value and a minimum value of the degrees of consumption of the plurality of unit areas exceeds a predetermined threshold value or not, each time the degree of consumption is obtained, and performs the data exchange process when the difference exceeds the predetermined threshold value.

10. The memory control apparatus according to claim 8, wherein the data exchange processing unit performs the data exchange process in a measurement area of the plurality of measurement areas, the temperature of which is equal to or less than a predetermined temperature.

11. The memory control apparatus according to claim 1, wherein the priority determination unit determines the priority, each time a certain time period elapses.

12. The memory control apparatus according to claim 11, wherein the priority determination unit determines the priority when a total write count exceeds a predetermined count, the total write count being a write count with respect to the memory from when a preceding determination of the priority is performed until when the certain time period elapses.

13. The memory control apparatus according to claim 11, wherein the priority determination unit determines the priority when a total consumption degree exceeds a predetermined value, the total consumption degree being the degree of consumption of the memory from when a preceding determination of the priority is performed until when the certain time period elapses.

14. The memory control apparatus according to claim 1, wherein each of the plurality of unit areas has a physical address allocated thereto, and when writing data to a logical address to which the physical address is unallocated is ordered, the write processing unit preferentially allocates the physical address of the unit area having a higher priority than other of the plurality of unit areas to the logical address and sets the physical address allocated as the data write destination.

15. A memory system, comprising:
    a memory having a plurality of measurement areas each including a plurality of unit areas;
    a temperature obtaining unit configured to obtain temperatures measured in the plurality of measurement areas;
    a priority determination unit configured to determine a priority for each unit area of the plurality of unit areas in accordance with a degree of consumption and the temperature of a corresponding measurement area including the plurality of unit areas, the degree of consumption being a degree of consumption of the unit area which is caused by a write process performed, wherein the priority determination unit obtains a characteristic amount based on the temperature of the measurement area when a power is turned on, and determines the priority to be a predetermined value when the characteristic amount is equal to or smaller than a predetermined amount; and a write processing unit configured to preferentially perform the write process with respect to a unit area having a higher priority than other of the plurality of unit areas as a data write destination.

16. An information processing system, comprising:

a host computer configured to order to perform a data write process;

a memory having a plurality of measurement areas each including a plurality of unit areas;

a temperature obtaining unit configured to obtain temperatures measured in the plurality of measurement areas;

a priority determination unit configured to determine a priority for each unit area of the plurality of unit areas in accordance with a degree of consumption and the temperature of a corresponding measurement area including the plurality of unit areas, the degree of consumption being a degree of consumption of the unit area which is caused by a write process performed, wherein the priority determination unit obtains a characteristic amount based on the temperature of the measurement area when a power is turned on, and determines the priority to be a predetermined value when the characteristic amount is equal to or smaller than a predetermined amount; and a write processing unit configured to preferentially perform the ordered write process with respect to a unit area having a higher priority than other of the plurality of unit areas as a data write destination.

17. A memory control method, comprising:

obtaining, in a memory having a plurality of measurement areas each including a plurality of unit areas, temperatures measured in the plurality of measurement areas by a temperature obtaining unit;

determining a priority for each unit area of the plurality of unit areas in accordance with a degree of consumption and the temperature of a corresponding measurement area including the plurality of unit areas by a priority determination unit, the degree of consumption being a degree of consumption of the unit area which is caused by a write process performed, wherein a characteristic amount is obtained based on the temperature of the measurement area when a power is turned on, and the priority is determined to be a predetermined value when the characteristic amount is equal to or smaller than a predetermined amount; and preferentially performing the write process with respect to a unit area having a higher priority than other of the plurality of unit areas as a data write destination by a write processing unit.

* * * * *